(12) United States Patent
Smith et al.

(10) Patent No.: US 7,368,927 B2
(45) Date of Patent: May 6, 2008

(54) PROBE HEAD HAVING A MEMBRANE SUSPENDED PROBE

(75) Inventors: Kenneth Smith, Portland, OR (US); Michael Jolley, Beaverton, OR (US); Victoria Van Syckel, Rhododendron, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 153 days.

(21) Appl. No.: 11/175,600

(22) Filed: Jul. 5, 2005

(65) Prior Publication Data

US 2006/0006889 A1    Jan. 12, 2006

Related U.S. Application Data

(60) Provisional application No. 60/586,299, filed on Jul. 7, 2004.

(51) Int. Cl.
*G01R 31/02* (2006.01)
(52) U.S. Cl. ..................................... 324/754
(58) Field of Classification Search .................... None
See application file for complete search history.

(56) References Cited

U.S. PATENT DOCUMENTS

| | | | |
|---|---|---|---|
| 1,337,866 A | 4/1920 | Whitacker | |
| 2,142,625 A | 1/1939 | Zoethout | |
| 2,376,101 A | 5/1945 | Tyzzer | |
| 2,389,668 A | 11/1945 | Johnson | |
| 3,176,091 A | 3/1965 | Hanson et al. | |
| 3,193,712 A | 7/1965 | Harris | |
| 3,230,299 A | 1/1966 | Radziekowski | |
| 3,401,126 A | 9/1968 | Miller et al. | |
| 3,429,040 A | 2/1969 | Miller | |
| 3,445,770 A | 5/1969 | Harmon | |
| 3,484,679 A | 12/1969 | Hodgson et al. | |
| 3,541,222 A | 11/1970 | Parks et al. | |
| 3,596,228 A | 7/1971 | Reed, Jr. et al. | |
| 3,609,539 A | 9/1971 | Gunthert | |
| 3,634,807 A | 1/1972 | Grobe et al. | |
| 3,654,585 A | 4/1972 | Wichersham | |
| 3,680,037 A | 7/1972 | Nellis et al. | |

(Continued)

FOREIGN PATENT DOCUMENTS

CN    1083975    3/1994

(Continued)

OTHER PUBLICATIONS

Basu, Saswata and Gleason, Reed "A Membrane Quadrant Probe for R&D Applications" Technical Document—Jun. 1997.

(Continued)

*Primary Examiner*—Jermele Hollington
(74) *Attorney, Agent, or Firm*—Chernoff, Vilhauer, McClung, & Stenzel

(57) ABSTRACT

A probe head including an elastic membrane capable of exerting a restoring force when one of the surfaces of the elastic membrane is distorted. A conductive probe includes a beam having a first end and a second end, with a probe tip proximate the first end for contacting a device under test. A beam contact proximate the second end of the beam. The beam being movable to deform at least one surface of the elastic membrane.

38 Claims, 11 Drawing Sheets

U.S. PATENT DOCUMENTS

| | | |
|---|---|---|
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,806,801 A | 4/1974 | Bove |
| 3,829,076 A | 8/1974 | Sofy |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,936,743 A | 2/1976 | Roch |
| 3,952,156 A | 4/1976 | Lahr |
| 3,970,934 A | 7/1976 | Aksu |
| 3,971,610 A | 7/1976 | Bughoff et al. |
| 3,976,959 A | 8/1976 | Gaspari |
| 3,992,073 A | 11/1976 | Buchoff et al. |
| 4,008,900 A | 2/1977 | Khoshaba |
| 4,027,935 A | 6/1977 | Byrnes et al. |
| 4,038,599 A | 7/1977 | Bove et al. |
| 4,038,894 A | 8/1977 | Knibbe et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,135,131 A | 1/1979 | Larsen et al. |
| 4,184,729 A | 1/1980 | Parks et al. |
| 4,275,446 A | 6/1981 | Blaess |
| 4,277,741 A | 7/1981 | Faxvog et al. |
| 4,284,033 A | 8/1981 | Del Rio |
| 4,284,682 A | 8/1981 | Tshirch et al. |
| 4,287,473 A | 9/1981 | Sawyer |
| 4,312,117 A | 1/1982 | Robillard et al. |
| 4,327,180 A | 4/1982 | Chen |
| 4,330,783 A | 5/1982 | Toia |
| 4,357,575 A | 11/1982 | Uren et al. |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,552,033 A | 11/1985 | Marzhauser |
| 4,567,321 A | 1/1986 | Harayama |
| 4,581,679 A | 4/1986 | Smolley |
| 4,588,950 A | 5/1986 | Henley |
| 4,593,243 A | 6/1986 | Lao et al. |
| 4,621,169 A | 11/1986 | Petinelli et al. |
| 4,626,618 A | 12/1986 | Takaoka et al. |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,663,840 A | 5/1987 | Ubbens |
| 4,673,839 A | 6/1987 | Veenendaal |
| 4,684,883 A | 8/1987 | Ackerman et al. |
| 4,691,163 A | 9/1987 | Blass et al. |
| 4,697,143 A | 9/1987 | Lockwood et al. |
| 4,705,447 A | 11/1987 | Smith |
| 4,707,657 A | 11/1987 | Boegh-Petersen |
| 4,711,563 A | 12/1987 | Lass |
| 4,713,347 A | 12/1987 | Mitchell et al. |
| 4,725,793 A | 2/1988 | Igarashi |
| 4,727,319 A | 2/1988 | Shahriary |
| 4,727,637 A | 3/1988 | Buckwitz et al. |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,766,384 A | 8/1988 | Kleinberg et al. |
| 4,772,846 A | 9/1988 | Reeds |
| 4,780,670 A | 10/1988 | Cherry |
| 4,791,363 A | 12/1988 | Logan |
| 4,793,814 A | 12/1988 | Zifcak |
| 4,795,962 A | 1/1989 | Yanagawa et al. |
| 4,805,627 A | 2/1989 | Klingenbeck et al. |
| 4,812,754 A | 3/1989 | Tracy et al. |
| 4,827,211 A | 5/1989 | Strid et al. |
| 4,831,494 A | 5/1989 | Arnold et al. |
| 4,837,507 A | 6/1989 | Hechtman |
| 4,839,587 A | 6/1989 | Flatley et al. |
| 4,849,689 A | 7/1989 | Gleason et al. |
| 4,853,624 A | 8/1989 | Rabjohn |
| 4,853,627 A | 8/1989 | Gleason et al. |
| 4,859,989 A | 8/1989 | McPherson |
| 4,864,227 A | 9/1989 | Sato |
| 4,871,883 A | 10/1989 | Guiol |
| 4,871,964 A | 10/1989 | Boll et al. |
| 4,891,584 A | 1/1990 | Kamieniecki et al. |
| 4,893,914 A | 1/1990 | Hancock et al. |
| 4,894,612 A | 1/1990 | Drake et al. |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,912,399 A | 3/1990 | Greub et al. |
| 4,916,002 A | 4/1990 | Carver |
| 4,916,398 A | 4/1990 | Rath |
| 4,918,383 A | 4/1990 | Huff et al. |
| 4,922,128 A | 5/1990 | Dhong et al. |
| 4,922,186 A | 5/1990 | Tsuchiya et al. |
| 4,922,192 A | 5/1990 | Gross et al. |
| 4,929,893 A | 5/1990 | Sato et al. |
| 4,975,638 A | 12/1990 | Evans et al. |
| 4,980,637 A | 12/1990 | Huff et al. |
| 4,983,910 A | 1/1991 | Majidi-Ahy et al. |
| 4,987,100 A | 1/1991 | McBride et al. |
| 4,991,290 A | 2/1991 | MacKay |
| 4,998,062 A | 3/1991 | Ikeda |
| 5,001,423 A | 3/1991 | Abrami et al. |
| 5,003,253 A | 3/1991 | Majidi-Ahy et al. |
| 5,020,219 A | 6/1991 | Leedy |
| 5,021,186 A | 6/1991 | Ota et al. |
| 5,030,907 A | 7/1991 | Yih et al. |
| 5,041,782 A | 8/1991 | Marzan |
| 5,045,781 A | 9/1991 | Gleason et al. |
| 5,059,898 A | 10/1991 | Barsotti et al. |
| 5,061,192 A | 10/1991 | Chapin et al. |
| 5,061,823 A | 10/1991 | Carroll |
| 5,066,357 A | 11/1991 | Smyth, Jr. et al. |
| 5,069,628 A | 12/1991 | Crumly |
| 5,082,627 A | 1/1992 | Stanbro |
| 5,084,671 A | 1/1992 | Miyata et al. |
| 5,089,774 A | 2/1992 | Nakano |
| 5,091,692 A | 2/1992 | Ohno et al. |
| 5,091,732 A | 2/1992 | Mileski et al. |
| 5,095,891 A | 3/1992 | Reitter |
| 5,097,101 A | 3/1992 | Trobough |
| 5,097,207 A | 3/1992 | Blanz |

| Patent No. | Date | Inventor(s) | Patent No. | Date | Inventor(s) |
|---|---|---|---|---|---|
| 5,107,076 A | 4/1992 | Bullock et al. | 5,478,748 A | 12/1995 | Akins, Jr. et al. |
| 5,126,286 A | 6/1992 | Chance | 5,479,108 A | 12/1995 | Cheng |
| 5,133,119 A | 7/1992 | Afshari et al. | 5,479,109 A | 12/1995 | Lau et al. |
| 5,134,365 A | 7/1992 | Okubo et al. | 5,481,196 A | 1/1996 | Nosov |
| 5,136,237 A | 8/1992 | Smith et al. | 5,481,936 A | 1/1996 | Yanagisawa |
| 5,142,224 A | 8/1992 | Smith et al. | 5,487,999 A | 1/1996 | Farnworth |
| 5,145,552 A | 9/1992 | Yoshizawa et al. | 5,488,954 A | 2/1996 | Sleva et al. |
| 5,148,103 A | 9/1992 | Pasiecznik, Jr. | 5,493,070 A | 2/1996 | Habu |
| 5,159,264 A | 10/1992 | Anderson | 5,493,236 A | 2/1996 | Ishii et al. |
| 5,159,267 A | 10/1992 | Anderson | 5,500,606 A | 3/1996 | Holmes |
| 5,159,752 A | 11/1992 | Mahant-Shetti et al. | 5,505,150 A | 4/1996 | James et al. |
| 5,160,883 A | 11/1992 | Blanz | 5,506,498 A | 4/1996 | Anderson et al. |
| 5,164,319 A | 11/1992 | Hafeman et al. | 5,506,515 A | 4/1996 | Godshalk et al. |
| 5,166,606 A | 11/1992 | Blanz | 5,510,792 A | 4/1996 | Ono et al. |
| 5,172,049 A | 12/1992 | Kiyokawa et al. | 5,511,010 A | 4/1996 | Burns |
| 5,172,050 A | 12/1992 | Swapp | 5,512,835 A | 4/1996 | Rivera et al. |
| 5,172,051 A | 12/1992 | Zamborelli | 5,517,126 A | 5/1996 | Yamaguchi |
| 5,177,438 A | 1/1993 | Littlebury et al. | 5,521,518 A | 5/1996 | Higgins |
| 5,180,977 A | 1/1993 | Huff | 5,521,522 A | 5/1996 | Abe et al. |
| 5,187,443 A | 2/1993 | Bereskin | 5,523,694 A | 6/1996 | Cole, Jr. |
| 5,198,752 A | 3/1993 | Miyata et al. | 5,528,158 A | 6/1996 | Sinsheimer et al. |
| 5,198,753 A | 3/1993 | Hamburgen | 5,530,372 A | 6/1996 | Lee et al. |
| 5,202,558 A | 4/1993 | Barker | 5,531,022 A | 7/1996 | Beaman et al. |
| 5,207,585 A | 5/1993 | Byrnes et al. | 5,532,608 A | 7/1996 | Behfar-Rad et al. |
| 5,214,243 A | 5/1993 | Johnson | 5,537,372 A | 7/1996 | Albrecht |
| 5,214,374 A | 5/1993 | St. Onge | 5,539,323 A | 7/1996 | Davis, Jr. |
| 5,225,037 A | 7/1993 | Elder et al. | 5,539,676 A | 7/1996 | Yamaguchi |
| 5,227,730 A | 7/1993 | King et al. | 5,565,788 A | 10/1996 | Burr et al. |
| 5,232,789 A | 8/1993 | Platz et al. | 5,565,881 A | 10/1996 | Phillips et al. |
| 5,233,197 A | 8/1993 | Bowman et al. | 5,569,591 A | 10/1996 | Kell et al. |
| 5,233,306 A | 8/1993 | Misra | 5,571,324 A | 11/1996 | Sago et al. |
| 5,245,292 A | 9/1993 | Milesky et al. | 5,578,932 A | 11/1996 | Adamian |
| 5,266,889 A | 11/1993 | Harwood et al. | 5,583,445 A | 12/1996 | Mullen |
| 5,267,088 A | 11/1993 | Nomura | 5,584,120 A | 12/1996 | Roberts |
| 5,270,664 A | 12/1993 | McMurtry et al. | 5,584,608 A | 12/1996 | Gillespie |
| 5,274,336 A | 12/1993 | Crook | 5,589,781 A | 12/1996 | Higgins et al. |
| 5,280,156 A | 1/1994 | Niori et al. | 5,600,256 A | 2/1997 | Woith et al. |
| 5,293,175 A | 3/1994 | Hemmie | 5,601,740 A | 2/1997 | Eldridge et al. |
| 5,298,972 A | 3/1994 | Heffner | 5,610,529 A | 3/1997 | Schwindt |
| 5,304,924 A | 4/1994 | Yamano et al. | 5,617,035 A | 4/1997 | Swapp |
| 5,313,157 A | 5/1994 | Pasiecznik, Jr. | 5,623,213 A | 4/1997 | Liu et al. |
| 5,315,237 A | 5/1994 | Iwakura et al. | 5,623,214 A | 4/1997 | Pasiecznik |
| 5,321,352 A | 6/1994 | Takebuchi | 5,628,057 A | 5/1997 | Phillips et al. |
| 5,321,453 A | 6/1994 | Mori et al. | 5,631,571 A | 5/1997 | Spaziani et al. |
| 5,326,412 A | 7/1994 | Schreiber et al. | 5,633,780 A | 5/1997 | Cronin |
| 5,355,079 A | 10/1994 | Evans et al. | 5,635,846 A | 6/1997 | Beaman et al. |
| 5,357,211 A | 10/1994 | Bryson et al. | 5,642,298 A | 6/1997 | Mallory et al. |
| 5,363,050 A | 11/1994 | Guo et al. | 5,644,248 A | 7/1997 | Fujimoto |
| 5,367,165 A | 11/1994 | Toda et al. | 5,653,939 A | 8/1997 | Hollis et al. |
| 5,369,368 A | 11/1994 | Kassen et al. | 5,656,942 A | 8/1997 | Watts et al. |
| 5,371,654 A | 12/1994 | Beaman et al. | 5,659,421 A | 8/1997 | Rahmel et al. |
| 5,373,231 A | 12/1994 | Boll et al. | 5,666,063 A | 9/1997 | Abercrombie et al. |
| 5,374,938 A | 12/1994 | Hatazawa et al. | 5,669,316 A | 9/1997 | Faz et al. |
| 5,376,790 A | 12/1994 | Linker et al. | 5,670,322 A | 9/1997 | Eggers et al. |
| 5,389,885 A | 2/1995 | Swart | 5,670,888 A | 9/1997 | Cheng |
| 5,395,253 A | 3/1995 | Crumly | 5,672,816 A | 9/1997 | Park et al. |
| 5,397,855 A | 3/1995 | Ferlier | 5,675,499 A | 10/1997 | Lee et al. |
| 5,404,111 A | 4/1995 | Mori et al. | 5,675,932 A | 10/1997 | Mauney |
| 5,408,188 A | 4/1995 | Katoh | 5,676,360 A | 10/1997 | Boucher et al. |
| 5,408,189 A | 4/1995 | Swart et al. | 5,685,232 A | 11/1997 | Inoue |
| 5,412,330 A | 5/1995 | Ravel et al. | 5,686,317 A | 11/1997 | Akram et al. |
| 5,412,866 A | 5/1995 | Woith et al. | 5,700,844 A | 12/1997 | Hedrick et al. |
| 5,414,565 A | 5/1995 | Sullivan et al. | 5,704,355 A | 1/1998 | Bridges |
| 5,422,574 A | 6/1995 | Kister | 5,715,819 A | 2/1998 | Svenson et al. |
| 5,441,690 A | 8/1995 | Ayola-Esquilin et al. | 5,720,098 A | 2/1998 | Kister |
| 5,451,884 A | 9/1995 | Sauerland | 5,723,347 A | 3/1998 | Hirano et al. |
| 5,453,404 A | 9/1995 | Leedy | 5,726,211 A | 3/1998 | Hedrick et al. |
| 5,457,398 A | 10/1995 | Schwindt et al. | 5,731,920 A | 3/1998 | Katsuragawa |
| 5,467,024 A | 11/1995 | Swapp | 5,742,174 A | 4/1998 | Kister et al. |
| 5,469,324 A | 11/1995 | Henderson et al. | 5,744,971 A | 4/1998 | Chan et al. |
| 5,475,316 A | 12/1995 | Hurley et al. | 5,748,506 A | 5/1998 | Bockelman |
| 5,476,211 A | 12/1995 | Khandros | 5,751,252 A | 5/1998 | Phillips |
| 5,477,011 A | 12/1995 | Singles et al. | 5,756,021 A | 5/1998 | Hendrick et al. |

| | | | | | |
|---|---|---|---|---|---|
| 5,767,690 A | 6/1998 | Fujimoto | 5,996,102 A | 11/1999 | Haulin |
| 5,772,451 A | 6/1998 | Dozier, II et al. | 5,998,228 A | 12/1999 | Eldridge et al. |
| 5,773,780 A | 6/1998 | Eldridge et al. | 5,998,768 A | 12/1999 | Hunter et al. |
| 5,777,485 A | 7/1998 | Tanaka et al. | 5,998,864 A | 12/1999 | Khandros et al. |
| 5,785,538 A | 7/1998 | Beaman et al. | 5,999,268 A | 12/1999 | Yonezawa et al. |
| 5,792,668 A | 8/1998 | Fuller et al. | 6,001,760 A | 12/1999 | Katsuda et al. |
| 5,793,213 A | 8/1998 | Bockelman et al. | 6,002,426 A | 12/1999 | Back et al. |
| 5,794,133 A | 8/1998 | Kashima | 6,013,586 A | 1/2000 | McGhee et al. |
| 5,804,607 A | 9/1998 | Hedrick et al. | 6,019,612 A | 2/2000 | Hasegawa et al. |
| 5,804,982 A | 9/1998 | Lo et al. | 6,023,103 A | 2/2000 | Chang et al. |
| 5,804,983 A | 9/1998 | Nakajima et al. | 6,028,435 A | 2/2000 | Nikawa |
| 5,806,181 A | 9/1998 | Khandros et al. | 6,029,344 A | 2/2000 | Khandros et al. |
| 5,807,107 A | 9/1998 | Bright et al. | 6,031,383 A | 2/2000 | Streib et al. |
| 5,810,607 A | 9/1998 | Shih et al. | 6,032,356 A | 3/2000 | Eldridge et al. |
| 5,811,751 A | 9/1998 | Leong et al. | 6,032,714 A | 3/2000 | Fenton |
| 5,811,982 A | 9/1998 | Beaman et al. | 6,033,935 A | 3/2000 | Dozier, II et al. |
| 5,813,847 A | 9/1998 | Eroglu | 6,034,533 A | 3/2000 | Tervo et al. |
| 5,814,847 A | 9/1998 | Shihadeh | 6,037,785 A | 3/2000 | Higgins |
| 5,820,014 A | 10/1998 | Dozier, II et al. | 6,042,712 A | 3/2000 | Mathieu |
| 5,821,763 A | 10/1998 | Beaman et al. | 6,043,563 A | 3/2000 | Eldridge et al. |
| 5,824,494 A | 10/1998 | Feldberg | 6,049,216 A | 4/2000 | Yang et al. |
| 5,829,128 A | 11/1998 | Eldridge et al. | 6,049,976 A | 4/2000 | Khandros |
| 5,829,437 A | 11/1998 | Bridges | 6,050,829 A | 4/2000 | Eldridge |
| 5,831,442 A | 11/1998 | Heigl | 6,051,422 A | 4/2000 | Kovacs et al. |
| 5,832,601 A | 11/1998 | Eldridge et al. | 6,052,653 A | 4/2000 | Mazur et al. |
| 5,833,601 A | 11/1998 | Swartz et al. | 6,054,651 A | 4/2000 | Fogel et al. |
| 5,838,160 A | 11/1998 | Beaman et al. | 6,054,869 A | 4/2000 | Hutton et al. |
| 5,841,288 A | 11/1998 | Meaney et al. | 6,059,982 A | 5/2000 | Palagonia et al. |
| 5,846,708 A | 12/1998 | Hollis et al. | 6,060,888 A | 5/2000 | Blackham et al. |
| 5,847,569 A | 12/1998 | Ho et al. | 6,060,892 A | 5/2000 | Yamagata |
| 5,848,500 A | 12/1998 | Kirk | 6,061,589 A | 5/2000 | Bridges et al. |
| 5,852,232 A | 12/1998 | Samsavar et al. | 6,062,879 A | 5/2000 | Beaman et al. |
| 5,854,608 A | 12/1998 | Leisten | 6,064,213 A | 5/2000 | Khandros et al. |
| 5,864,946 A | 2/1999 | Eldridge et al. | 6,064,217 A | 5/2000 | Smith |
| 5,867,073 A | 2/1999 | Weinreb et al. | 6,064,218 A | 5/2000 | Godfrey et al. |
| 5,869,326 A | 2/1999 | Hofmann | 6,066,911 A | 5/2000 | Lindemann et al. |
| 5,869,974 A | 2/1999 | Akram et al. | 6,078,183 A | 6/2000 | Cole, Jr. |
| 5,874,361 A | 2/1999 | Collins et al. | 6,078,500 A | 6/2000 | Beaman et al. |
| 5,876,082 A | 3/1999 | Kempf et al. | 6,090,261 A | 7/2000 | Mathieu |
| 5,878,486 A | 3/1999 | Eldridge et al. | 6,091,236 A | 7/2000 | Piety et al. |
| 5,883,522 A | 3/1999 | O'Boyle | 6,091,255 A | 7/2000 | Godfrey |
| 5,883,523 A | 3/1999 | Ferland et al. | 6,096,567 A | 8/2000 | Kaplan et al. |
| 5,884,398 A | 3/1999 | Eldridge et al. | 6,100,815 A | 8/2000 | Pailthorp |
| 5,888,075 A | 3/1999 | Hasegawa et al. | 6,104,201 A | 8/2000 | Beaman et al. |
| 5,892,539 A | 4/1999 | Colvin | 6,104,206 A | 8/2000 | Verkuil |
| 5,896,038 A | 4/1999 | Budnaitis et al. | 6,110,823 A | 8/2000 | Eldridge et al. |
| 5,900,737 A | 5/1999 | Graham et al. | 6,114,864 A | 9/2000 | Soejima et al. |
| 5,900,738 A | 5/1999 | Khandros et al. | 6,114,865 A | 9/2000 | Lagowski et al. |
| 5,903,143 A | 5/1999 | Mochizuki et al. | 6,118,287 A | 9/2000 | Boll et al. |
| 5,905,421 A | 5/1999 | Oldfield | 6,118,894 A | 9/2000 | Schwartz et al. |
| 5,910,727 A | 6/1999 | Fujihara et al. | 6,124,725 A | 9/2000 | Sato |
| 5,912,046 A | 6/1999 | Eldridge et al. | 6,127,831 A | 10/2000 | Khoury et al. |
| 5,914,613 A | 6/1999 | Gleason et al. | 6,137,302 A | 10/2000 | Schwindt |
| 5,914,614 A | 6/1999 | Beaman et al. | 6,144,212 A | 11/2000 | Mizuta |
| 5,916,689 A | 6/1999 | Collins et al. | 6,147,502 A | 11/2000 | Fryer et al. |
| 5,917,707 A | 6/1999 | Khandros et al. | 6,147,851 A | 11/2000 | Anderson |
| 5,926,029 A | 7/1999 | Ference et al. | 6,150,186 A | 11/2000 | Chen et al. |
| 5,926,951 A | 7/1999 | Khandros et al. | 6,160,407 A | 12/2000 | Nikawa |
| 5,944,093 A | 8/1999 | Viswanath | 6,160,412 A | 12/2000 | Martel et al. |
| 5,945,836 A | 8/1999 | Sayre et al. | 6,166,553 A | 12/2000 | Sinsheimer |
| 5,949,383 A | 9/1999 | Hayes et al. | 6,168,974 B1 | 1/2001 | Chang et al. |
| 5,949,579 A | 9/1999 | Baker | 6,169,410 B1 | 1/2001 | Grace et al. |
| 5,959,461 A | 9/1999 | Brown et al. | 6,172,337 B1 | 1/2001 | Johnsgard et al. |
| 5,963,364 A | 10/1999 | Leong et al. | 6,174,744 B1 | 1/2001 | Watanabe et al. |
| 5,970,429 A | 10/1999 | Martin | 6,175,228 B1 | 1/2001 | Zamborelli et al. |
| 5,973,504 A | 10/1999 | Chong | 6,181,144 B1 | 1/2001 | Hembree et al. |
| 5,974,662 A | 11/1999 | Eldridge et al. | 6,181,149 B1 | 1/2001 | Godfrey et al. |
| 5,981,268 A | 11/1999 | Kovacs et al. | 6,181,297 B1 | 1/2001 | Leisten |
| 5,982,166 A | 11/1999 | Mautz | 6,181,416 B1 | 1/2001 | Falk |
| 5,983,493 A | 11/1999 | Eldridge et al. | 6,184,053 B1 | 2/2001 | Eldridge et al. |
| 5,993,611 A | 11/1999 | Moroney, III et al. | 6,184,587 B1 | 2/2001 | Khandros et al. |
| 5,994,152 A | 11/1999 | Khandros | 6,184,845 B1 | 2/2001 | Leisten et al. |
| 5,995,914 A | 11/1999 | Cabot | 6,191,596 B1 | 2/2001 | Abiko |

| Patent | Date | Inventor |
|---|---|---|
| 6,194,720 B1 | 2/2001 | Li et al. |
| 6,206,273 B1 | 3/2001 | Beaman et al. |
| 6,208,225 B1 | 3/2001 | Miller |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathieu et al. |
| 6,256,882 B1 | 7/2001 | Gleason et al. |
| 6,257,564 B1 | 7/2001 | Avneri et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,395,480 B1 | 5/2002 | Hefti |
| 6,396,296 B1 | 5/2002 | Tartar et al. |
| 6,396,298 B1 | 5/2002 | Young et al. |
| 6,400,168 B2 | 6/2002 | Matsunaga et al. |
| 6,404,211 B2 | 6/2002 | Hamel et al. |
| 6,404,213 B2 | 6/2002 | Noda |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,419,500 B1 | 7/2002 | Kister |
| 6,420,722 B2 | 7/2002 | Moore et al. |
| 6,420,887 B1 | 7/2002 | Kister et al. |
| 6,424,164 B1 | 7/2002 | Kister |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,552 B2 | 2/2003 | Kister |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,530,148 B1 | 3/2003 | Kister |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,844 B1 | 4/2003 | Eldridge et al. |
| 6,559,671 B2 | 5/2003 | Miller et al. |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,586,956 B2 | 7/2003 | Aldaz et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,621,082 B2 | 9/2003 | Morita et al. |
| 6,621,260 B2 | 9/2003 | Eldridge et al. |
| 6,622,103 B1 | 9/2003 | Miller |

| Patent Number | Date | Inventor |
|---|---|---|
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,386 B2 | 3/2004 | Gleason et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller et al. |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,839,964 B2 | 1/2005 | Henson |
| 6,845,491 B2 | 1/2005 | Miller et al. |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijyo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |

| | | | | | | |
|---|---|---|---|---|---|---|
| 6,930,498 B2 | 8/2005 | Tervo et al. | | 7,088,981 B2 | 8/2006 | Chang |
| 6,933,713 B2 | 8/2005 | Cannon | | 7,096,133 B1 | 8/2006 | Martin et al. |
| 6,933,717 B1 | 8/2005 | Dogaru et al. | | 7,148,711 B2 | 12/2006 | Tervo et al. |
| 6,933,725 B2 | 8/2005 | Lim et al. | | 7,187,188 B2 | 3/2007 | Andrews et al. |
| 6,933,736 B2 | 8/2005 | Kobayashi et al. | | 7,188,037 B2 | 3/2007 | Hidehira |
| 6,933,737 B2 | 8/2005 | Sugawara | | 2001/0002794 A1 | 6/2001 | Draving et al. |
| 6,937,020 B2 | 8/2005 | Munson et al. | | 2001/0009061 A1 | 7/2001 | Gleason et al. |
| 6,937,037 B2 | 8/2005 | Eldridge et al. | | 2001/0009377 A1 | 7/2001 | Schwindt et al. |
| 6,937,039 B2 | 8/2005 | Barr et al. | | 2001/0010468 A1 | 8/2001 | Gleason et al. |
| 6,937,040 B2 | 8/2005 | Maeda et al. | | 2001/0020283 A1 | 9/2001 | Sakaguchi |
| 6,937,042 B2 | 8/2005 | Yoshida et al. | | 2001/0024116 A1 | 9/2001 | Draving |
| 6,937,045 B2 | 8/2005 | Sinclair | | 2001/0030549 A1 | 10/2001 | Gleason et al. |
| 6,937,341 B1 | 8/2005 | Woollam et al. | | 2001/0043073 A1 | 11/2001 | Montoya |
| 6,940,264 B2 | 9/2005 | Ryken et al. | | 2001/0044152 A1 | 11/2001 | Burnett |
| 6,940,283 B2 | 9/2005 | McQueeney | | 2001/0045511 A1 | 11/2001 | Moore et al. |
| 6,943,563 B2 | 9/2005 | Martens | | 2001/0054906 A1 | 12/2001 | Fujimura |
| 6,943,571 B2 | 9/2005 | Worledge | | 2002/0005728 A1 | 1/2002 | Babson et al. |
| 6,943,574 B2 | 9/2005 | Altmann et al. | | 2002/0008533 A1 | 1/2002 | Ito et al. |
| 6,944,380 B1 | 9/2005 | Hideo et al. | | 2002/0009377 A1 | 1/2002 | Shafer |
| 6,946,375 B2 | 9/2005 | Hattori et al. | | 2002/0009378 A1 | 1/2002 | Obara |
| 6,946,859 B2 | 9/2005 | Karavakis et al. | | 2002/0011859 A1 | 1/2002 | Smith et al. |
| 6,946,860 B2 | 9/2005 | Cheng et al. | | 2002/0011863 A1 | 1/2002 | Takahashi et al. |
| 6,948,391 B2 | 9/2005 | Brassell et al. | | 2002/0050828 A1 | 5/2002 | Seward, IV et al. |
| 6,948,981 B2 | 9/2005 | Pade | | 2002/0070743 A1 | 6/2002 | Felici et al. |
| 6,970,001 B2 | 11/2005 | Chheda et al. | | 2002/0070745 A1 | 6/2002 | Johnson et al. |
| 6,987,483 B2 | 1/2006 | Tran | | 2002/0079911 A1 | 6/2002 | Schwindt |
| 7,001,785 B1 | 2/2006 | Chen | | 2002/0109514 A1 | 8/2002 | Brandorff et al. |
| 7,002,133 B2 | 2/2006 | Beausoleil et al. | | 2002/0118034 A1 | 8/2002 | Laureanti |
| 7,002,363 B2 | 2/2006 | Mathieu | | 2002/0149377 A1 | 10/2002 | Hefti et al. |
| 7,002,364 B2 | 2/2006 | Kang et al. | | 2002/0153909 A1 | 10/2002 | Petersen et al. |
| 7,003,184 B2 | 2/2006 | Ronnekleiv et al. | | 2002/0163769 A1 | 11/2002 | Brown |
| 7,005,842 B2 | 2/2006 | Fink et al. | | 2002/0168659 A1 | 11/2002 | Hefti et al. |
| 7,005,868 B2 | 2/2006 | McTigue | | 2002/0180466 A1 | 12/2002 | Hiramatsu et al. |
| 7,005,879 B1 | 2/2006 | Robertazzi | | 2002/0197709 A1 | 12/2002 | Van der Welde et al. |
| 7,006,046 B2 | 2/2006 | Aisenbrey | | 2003/0010877 A1 | 1/2003 | Landreville et al. |
| 7,007,380 B2 | 3/2006 | Das et al. | | 2003/0030822 A1 | 2/2003 | Finarov |
| 7,009,188 B2 | 3/2006 | Wang | | 2003/0032000 A1 | 2/2003 | Liu et al. |
| 7,009,383 B2 | 3/2006 | Harwood et al. | | 2003/0040004 A1 | 2/2003 | Hefti et al. |
| 7,009,415 B2 | 3/2006 | Kobayashi et al. | | 2003/0057513 A1 | 3/2003 | Leedy |
| 7,011,531 B2 | 3/2006 | Egitto et al. | | 2003/0057957 A1 | 3/2003 | McQuade et al. |
| 7,012,425 B2 | 3/2006 | Shoji | | 2003/0062915 A1 | 4/2003 | Arnold et al. |
| 7,012,441 B2 | 3/2006 | Chou et al. | | 2003/0072549 A1 | 4/2003 | Facer et al. |
| 7,013,221 B1 | 3/2006 | Friend et al. | | 2003/0077649 A1 | 4/2003 | Cho et al. |
| 7,014,499 B2 | 3/2006 | Yoon | | 2003/0088180 A1 | 5/2003 | VanVeen et al. |
| 7,015,455 B2 | 3/2006 | Mitsuoka et al. | | 2003/0119057 A1 | 6/2003 | Gascoyne et al. |
| 7,015,689 B2 | 3/2006 | Kasajima et al. | | 2003/0139662 A1 | 7/2003 | Seidman |
| 7,015,690 B2 | 3/2006 | Wang et al. | | 2003/0139790 A1 | 7/2003 | Ingle et al. |
| 7,015,703 B2 | 3/2006 | Hopkins et al. | | 2003/0155939 A1 | 8/2003 | Lutz et al. |
| 7,015,707 B2 | 3/2006 | Cherian | | 2003/0170898 A1 | 9/2003 | Gunderson et al. |
| 7,015,708 B2 | 3/2006 | Beckous et al. | | 2003/0184332 A1 | 10/2003 | Tomimatsu et al. |
| 7,015,709 B2 | 3/2006 | Capps et al. | | 2004/0015060 A1 | 1/2004 | Samsoondar et al. |
| 7,015,710 B2 | 3/2006 | Yoshida et al. | | 2004/0021475 A1 | 2/2004 | Ito et al. |
| 7,015,711 B2 | 3/2006 | Rothaug et al. | | 2004/0061514 A1 | 4/2004 | Schwindt et al. |
| 7,019,541 B2 | 3/2006 | Kittrell | | 2004/0066181 A1 | 4/2004 | Thies |
| 7,019,544 B1 | 3/2006 | Jacobs et al. | | 2004/0069776 A1 | 4/2004 | Fagrell et al. |
| 7,019,701 B2 | 3/2006 | Ohno et al. | | 2004/0090223 A1 | 5/2004 | Yonezawa |
| 7,020,360 B2 | 3/2006 | Satomura et al. | | 2004/0095145 A1 | 5/2004 | Boudiaf et al. |
| 7,020,363 B2 | 3/2006 | Johannessen | | 2004/0095641 A1 | 5/2004 | Russum et al. |
| 7,022,976 B1 | 4/2006 | Santana, Jr. et al. | | 2004/0100276 A1 | 5/2004 | Fanton |
| 7,022,985 B2 | 4/2006 | Knebel et al. | | 2004/0100297 A1 | 5/2004 | Tanioka et al. |
| 7,023,225 B2 | 4/2006 | Blackwood | | 2004/0108847 A1 | 6/2004 | Stoll et al. |
| 7,023,226 B2 | 4/2006 | Okumura et al. | | 2004/0113640 A1 | 6/2004 | Cooper et al. |
| 7,023,231 B2 | 4/2006 | Howland, Jr. et al. | | 2004/0130787 A1 | 7/2004 | Thome-Forster et al. |
| 7,025,628 B2 | 4/2006 | LaMeres et al. | | 2004/0132222 A1 | 7/2004 | Hembree et al. |
| 7,026,832 B2 | 4/2006 | Chaya et al. | | 2004/0134899 A1 | 7/2004 | Hiramatsu et al. |
| 7,026,833 B2 | 4/2006 | Rincon et al. | | 2004/0147034 A1 | 7/2004 | Gore et al. |
| 7,026,834 B2 | 4/2006 | Hwang | | 2004/0162689 A1 | 8/2004 | Jamneala et al. |
| 7,026,835 B2 | 4/2006 | Farnworth et al. | | 2004/0175294 A1 | 9/2004 | Ellison et al. |
| 7,030,599 B2 | 4/2006 | Douglas | | 2004/0186382 A1 | 9/2004 | Modell et al. |
| 7,030,827 B2 | 4/2006 | Mahler et al. | | 2004/0193382 A1 | 9/2004 | Adamian et al. |
| 7,032,307 B2 | 4/2006 | Matsunaga et al. | | 2004/0197771 A1 | 10/2004 | Powers et al. |
| 7,034,553 B2 | 4/2006 | Gilboe | | 2004/0199350 A1 | 10/2004 | Blackham et al. |
| 7,035,738 B2 | 4/2006 | Matsumoto et al. | | 2004/0207072 A1 | 10/2004 | Hiramatsu et al. |

| | | | |
|---|---|---|---|
| 2004/0207424 A1 | 10/2004 | Hollman | |
| 2004/0239338 A1 | 12/2004 | Johnsson et al. | |
| 2004/0246004 A1 | 12/2004 | Heuermann | |
| 2004/0251922 A1 | 12/2004 | Martens et al. | |
| 2005/0024069 A1 | 2/2005 | Hayden et al. | |
| 2005/0026276 A1 | 2/2005 | Chou | |
| 2005/0030047 A1 | 2/2005 | Adamian | |
| 2005/0054029 A1 | 3/2005 | Tomimatsu et al. | |
| 2005/0062533 A1 | 3/2005 | Vice | |
| 2005/0083130 A1 | 4/2005 | Grilo | |
| 2005/0101846 A1 | 5/2005 | Fine et al. | |
| 2005/0156675 A1 | 7/2005 | Rohde et al. | |
| 2005/0164160 A1 | 7/2005 | Gunter et al. | |
| 2005/0165316 A1 | 7/2005 | Lowery et al. | |
| 2005/0168722 A1 | 8/2005 | Forstner et al. | |
| 2005/0174191 A1 | 8/2005 | Brunker et al. | |
| 2005/0178980 A1 | 8/2005 | Skidmore et al. | |
| 2005/0195124 A1 | 9/2005 | Puente Baliarda et al. | |
| 2005/0236587 A1 | 10/2005 | Kodama et al. | |
| 2005/0237102 A1 | 10/2005 | Tanaka | |
| 2006/0052075 A1 | 3/2006 | Galivanche et al. | |
| 2006/0155270 A1 | 7/2006 | Hancock et al. | |
| 2006/0226864 A1 | 10/2006 | Kramer | |
| 2007/0024506 A1 | 2/2007 | Hardacker | |
| 2007/0030021 A1 | 2/2007 | Cowan et al. | |

FOREIGN PATENT DOCUMENTS

| | | |
|---|---|---|
| DE | 3637549 | 5/1988 |
| DE | 42 23 658 | 1/1993 |
| DE | 19522774 | 1/1997 |
| DE | 10000324 | 7/2001 |
| EP | 230348 | 7/1985 |
| EP | 0230348 | 7/1987 |
| EP | 0259163 | 9/1988 |
| EP | 0 304 868 | 3/1989 |
| EP | 0 945 736 | 9/1999 |
| EP | 0945736 | 9/1999 |
| EP | 945736 A3 | 9/1999 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 62239050 | 10/1987 |
| JP | 63-108736 | 5/1988 |
| JP | 63-129640 | 6/1988 |
| JP | 63-143814 | 6/1988 |
| JP | 63-318745 | 12/1988 |
| JP | 1-165968 | 6/1989 |
| JP | 1-214038 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-129393 | 5/1990 |
| JP | 2-191352 | 7/1990 |
| JP | 3-175367 | 7/1991 |
| JP | 3-196206 | 8/1991 |
| JP | 3-228348 | 10/1991 |
| JP | 4-130639 | 5/1992 |
| JP | 4-159043 | 6/1992 |
| JP | 4-165361 | 6/1992 |
| JP | 4-206930 | 7/1992 |
| JP | 4-340248 | 11/1992 |
| JP | 5-082631 | 4/1993 |
| JP | 51-57790 | 6/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-12871 | 1/1995 |
| JP | 7012871 | 1/1995 |
| JP | 8-35987 | 2/1996 |
| JP | 8-261898 | 10/1996 |
| JP | 8-330401 | 12/1996 |
| JP | 10-116866 | 5/1998 |
| JP | 11-4001 | 1/1999 |
| JP | 11-023975 | 1/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| SU | 843040 | 6/1981 |
| SU | 1392603 | 4/1988 |
| WO | WO 98/07040 | 2/1998 |
| WO | WO 01/07207 | 7/1999 |
| WO | WO 00/73905 | 12/2000 |
| WO | WO 01/69656 | 9/2001 |
| WO | WO 2004/065944 | 8/2004 |
| WO | WO 2004/079299 | 9/2004 |
| WO | WO 2005/062025 | 7/2005 |

OTHER PUBLICATIONS

Saswata Basu and Reed Gleason, "A Membrane Quadrant Probe for R&D Applications," Cascade Microtech, Inc. Beaverton, Oregon, Jun. 1997.

Ynog-Dai Kim, Jun-Hwan Sim, Jae-Woo Nam and Jong-Hyun Lee, "Fabrication of a Silicon Micro-Probe for Vertical Probe Card Application," Jpn. J. appl. Phys. vol. 37 (1998) pp. 7070-7073 Part 1, No. 12B, Dec. 1998.

Donald G. Fink, "Bridge Circuits, Detectors, and Amplifiers,"Electronic Engineers' Handbook, first Edition, 1975, pp. 17-22-17-27, McGraw-Hill, Inc. New York.

Cascade Microtech, Inc. "Information sheet on Cascade Microtech's Pyramid Probe," Copyright 2001, Cascade Microtech, Inc., 2430 NW 206 th Avenue, Beaverton, OR 97006, USA, 5 pages.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

US 7,368,927 B2

PROBE HEAD HAVING A MEMBRANE SUSPENDED PROBE

CROSS-REFERENCE TO RELATED APPLICATIONS

This application claims the benefit of U.S. Provisional Patent Application No. 60/586,299 entitled "Probe Head Having a Membrane Suspended Probe," invented by Kenneth Smith, Michael Jolley and Victoria Van Sycle on Jul. 7, 2004.

BACKGROUND OF THE INVENTION

The present invention relates to probing assemblies of the type commonly used for testing integrated circuits (ICs) and, in particular, to a probing assembly providing finely pitched, compliant probes having very low inductance.

Integrated circuit technology permits fabrication of a number of discrete electronic circuit elements on a single substrate or "wafer." After fabrication, this wafer is divided into a number of rectangular-shaped chips or dies where each die includes a rectangular or other regular arrangement of metallized contact pads or bond pads through which input and output connections can be made to the electronic circuit on the die. Although each die is eventually packaged separately, for efficiency, testing of the circuit formed on each die is preferably performed while the dies are still joined together on the wafer. One typical procedure is to support the wafer on a flat stage or "chuck" and move the wafer in X, Y, and Z directions relative to the head of a probing assembly so that probe tips projecting from the probing assembly can be moved from die to die for consecutive engagement with the contact pads of each die. Respective signal, power, and ground conductors connect the probe tips to test instrumentation enabling each circuit to be sequentially connected to and operated by the test instrumentation.

One type of probing assembly used for testing integrated circuits utilizes a plurality of needle-like contacts arranged in a pattern matching the pattern of the contact pads on the device to be tested. FIGS. 1 and 2 show a probing assembly 20 that includes a needle card probe head 22 comprising an array of needle-like probes 24 restrained by upper 26 and lower 28 needle cards. The upper and lower needle cards 26, 28 contain patterns of holes that correspond to the contact pad arrangement of the IC or other device to be tested with the probing assembly 20. The lower end of each of the probes 24 extends through one of the holes in the lower needle card 28, terminating in a pointed probe tip. The upper end of each of the probes 24 is restrained by a hole in the upper needle card 26. The holes of the upper needle card 26 are covered by electrically conductive pads 32 arranged on a surface of a space transformer 30 (indicated by a bracket) preventing the upper ends of the probes from sliding through the upper needle card 26 when the lower ends of the probes are brought into pressing engagement with the contact pads on the device under test. The space transformer is a rigid, multilayer plate having electrically conductive contacts 32, 36 on the opposing surfaces that are electrically connected by conductive traces 34 that extend through the plate. The space transformer 30 re-routes the electrical signals from the finely pitched pattern of the needle probes 24 to a more coarsely pitched pattern obtainable on a probe card 38, a printed circuit board through which the test instrumentation is connected to the probing assembly.

The exemplary probing assembly 20 also includes an interposer 39 disposed between the space transformer 30 and the probe card 38. The interposer 39 typically includes a plurality of elastically deformable contacts electrically connected through a substrate to provide compliant electrical connections on opposing sides of the substrate. The compliance of the conductors compensates for variations in the distances separating the respective terminals of the space transformer 30 and the probe card 38 promoting reliable electrical connections there between.

The needle probes 24 typically comprise a wire including complementary bends that form an upper section and a lower section that lie generally parallel to, but offset from each other, adjacent, respectively, the upper and lower ends of the probe. The hole pattern of the lower needle card 28 is offset from the hole pattern in the upper needle card 26 to accommodate the offset of the ends of the probes. When the lower end of a probe is pressed into engagement with the contact pads on a die, the substantially columnar probe can bend at the offset, acting like a spring. The compliance provided by the elastic bending of the probe accommodates variations in probe length, probe head planarity, and wafer topography.

Needle card probing assemblies have been used extensively in wafer testing, but the trend in electronic production, and, in particular, IC production, to higher frequency, more complex circuits having smaller circuit elements and geometries has exposed several limitations of this type of probing device. First, the pitch, the distance between the probes, is limited by manufacturing tolerances and assembly considerations to about 125 □m, a spacing greater than desirable for many ICs having finely pitched contact pads. In addition, the metallic contact pads of the dies oxidize rapidly and the tip of the probe must sharpened so that it can be pushed into the surface of the contact pad to achieve the good conductivity required for accurate measurements. This causes rapid dulling of the pointed probe ends, frequent bending or breaking of the probes, and may damage the contact pad if penetration is too great. The contact pad material also adheres to the probe and frequent cleaning is required which often damages the probes. Moreover, the inductance of parallel conductors is a function of the length and distance between the conductors. Typically, the relatively long, closely spaced, needle-like probes exhibit a single path inductance of 1-2 nH which is sufficient to substantially distort high frequency signals, limiting the usefulness of needle-type probes for testing high frequency devices.

A second type of probing assembly is described by Gleason et al. in U.S. Pat. No. 6,708,386 B2, incorporated herein by reference. Referring to FIG. 3, a membrane probing assembly 40 includes a probe card 52 on which data and signal lines 48, 50 from the instrumentation are arranged and a membrane probing assembly 42. Referring to FIGS. 3-4, the membrane probing assembly 42 includes a support element 54 formed of incompressible material such as a hard polymer. This element is detachably connected to the upper side of the probe card by screws 56 and corresponding nuts 58 (each screw passes through a respective attachment arm 60 of the support element, and a separate backing element 62 evenly distributes the clamping pressure of the screws over the entire back side of the supporting element). Different probing assemblies having different contact arrangements can be quickly substituted for each other as needed for probing devices having different arrangements of contact pads.

Referring to FIGS. 4-5, the support element 54 includes a rearward base portion 64 to which the attachment arms 60 are integrally joined. Also included on the support element 54 is a forward support or plunger 66 that projects outwardly from the flat base portion. This forward support has angled sides 68 that converge toward a flat support surface 70 so as to give the forward support the shape of a truncated pyramid. Referring also to FIG. 4, a flexible membrane assembly 72 is attached to the support after being aligned by means of alignment pins 74 included on the base portion. This flexible membrane assembly is formed by one or more plies of insulative polyimide film, and flexible conductive layers or strips are provided between or on these plies to form the data/signal lines 76.

When the support element 54 is mounted on the upper side of the probe card 52 as shown in FIG. 5, the forward support 66 protrudes through a central opening 78 in the probe card so as to present the contacts which are arranged on a central region 80 of the flexible membrane assembly in suitable position for pressing engagement with the contact pads of the die or other device under test. Referring to FIG. 4, the membrane assembly includes radially extending arm segments 82 that are separated by inwardly curving edges 84 that give the assembly the shape of a formee cross, and these segments extend in an inclined manner along the angled sides 68 thereby clearing any upright components surrounding the pads. A series of contact pads 86 terminate the data/signal lines 76 so that when the support element is mounted, these pads electrically engage corresponding termination pads provided on the upper side of the probe card so that the data/signal lines 48 on the probe card are electrically connected to the contacts on the central region.

The probing assembly 42 is capable of probing a dense arrangement of contact pads over a large number of contact cycles in a manner that provides generally reliable electrical connection between the contacts and pads in each cycle despite oxide buildup on the contact pads. The membrane assembly is so constructed and connected to the support element that the contacts on the membrane assembly wipe or scrub, in a locally controlled manner, laterally across the contact pads when brought into pressing engagement with these pads.

FIG. 8 is an enlarged view of the central region 80a of the membrane assembly 72a illustrating an embodiment in which the contacts 88 are arranged in a square-like pattern suitable for engagement with a corresponding square-like arrangement of contact pads on a die. The membrane assembly provides space transformation from the very fine pitch of the densely packed contacts 88 to the more coarsely pitched contact pads 86 terminating the data/signal lines 76.

Referring also to FIG. 9a, which represents a sectional view taken along lines 9a-9a in FIG. 8, each contact comprises a relatively thick rigid beam 90 at one end of which is formed a rigid contact bump 92. The contact bump includes thereon a contacting portion 93 which comprises a nub of rhodium fused to the contact bump. Using electroplating, each beam is formed in an overlapping connection with the end of a flexible conductive trace 76a to form a joint therewith. This conductive trace in conjunction with a back-plane conductive layer 94 effectively provides a controlled impedance data or signal line to the contact because its dimensions are established using a photolithographic process.

The membrane assembly is interconnected to the flat support surface 70 by an interposed elastomeric layer 98, which layer is coextensive with the support surface and can be formed by a silicone rubber compound. The flat support surface, as previously mentioned, is made of incompressible material and is preferably a hard dielectric such as polysulfone or glass. When one of the contacts 88 is brought into pressing engagement with a respective contact pad 100 of a die, as indicated in FIG. 10, the resulting off-center force on the rigid beam 90 and bump 92 structure causes the beam to pivot or tilt against the elastic recovery force provided by the elastomeric pad 98. This tilting motion is localized in the sense that a forward portion 102 of the beam moves a greater distance toward the flat support surface 70 than a rearward portion 104 of the same beam. The effect is such as to drive the contact into lateral scrubbing movement across the contact pad with a dashed-line and solid-line representation showing the beginning and ending positions, respectively, of the contact on the pad. In this fashion, the insulating oxide buildup on each contact pad is abraded so as to ensure adequate contact-to-pad electrical connections.

A locally scrubbing, membrane probing assembly provides contacts which can be finely pitched to engage contact pads on physically smaller devices and combines high conductivity with ruggedness and resistance to wear and damage. Membrane suspended probes can also combine a greater section and shorter length to exhibit much lower inductance than typical needle probes permitting their use at higher frequencies and producing less signal distortion at all frequencies. However, the probes and the signal and data lines are created on the surface of the membrane and connect to probe card terminals arranged around the periphery of the membrane. Heretofore, membrane suspended probes have not been adaptable for use with the probe cards and space transformers suitable for use with a needle card-type probe heads where the signal paths pass through the center of the probing assembly and are arranged substantially parallel to the central axis of the probing assembly. What is desired, therefore, is a device and method for adapting robust, finely pitched, low inductance membrane suspended probes for use with the components of a probing assembly suited for use with a needle-type probe head.

BRIEF DESCRIPTION OF THE SEVERAL
VIEWS OF THE DRAWINGS

DETAILED DESCRIPTION OF PREFERRED EMBODIMENT

Figure 1:
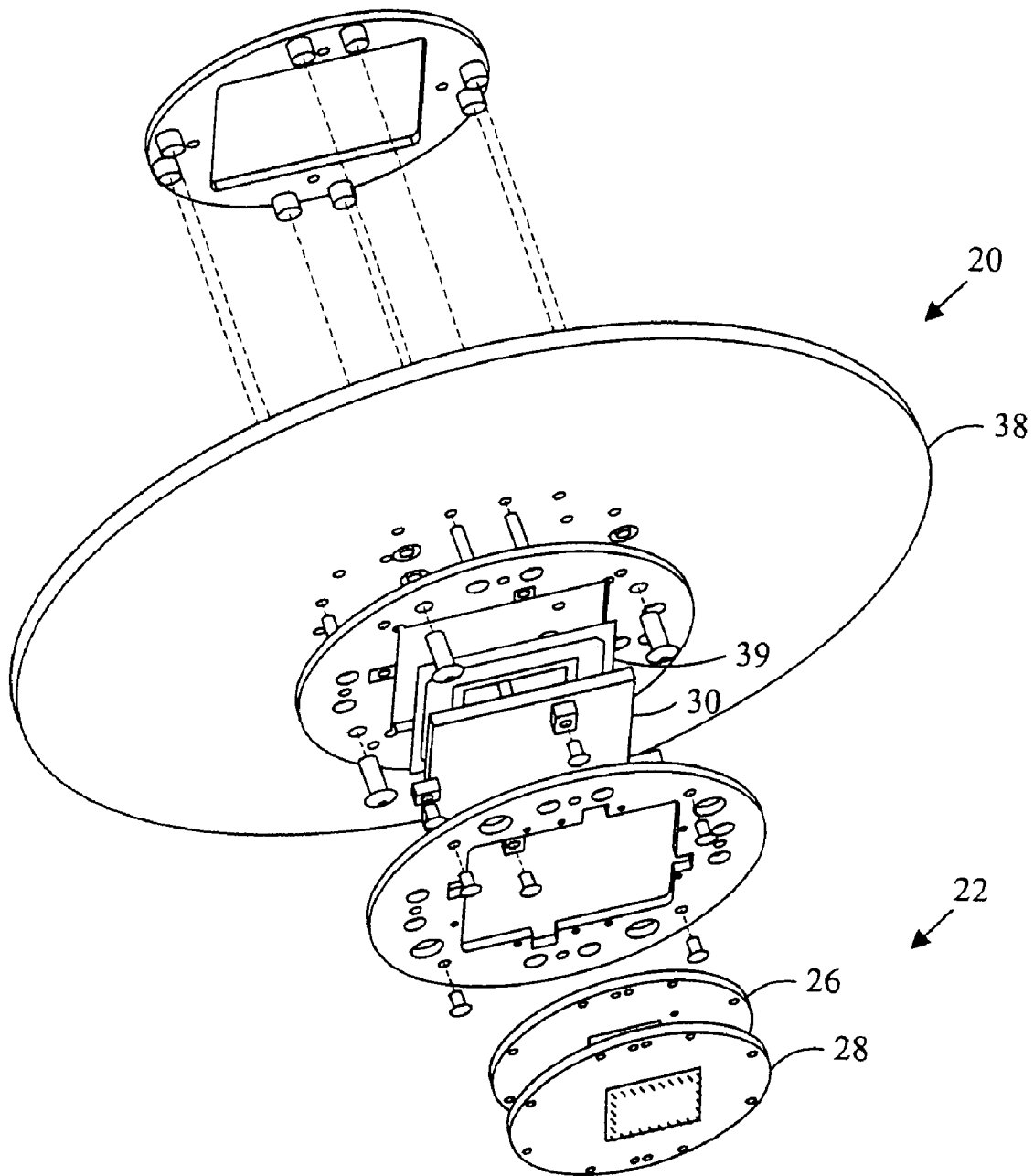
FIG. 1 is an exploded perspective schematic diagram of a needle-type probing assembly.
Figure 2:
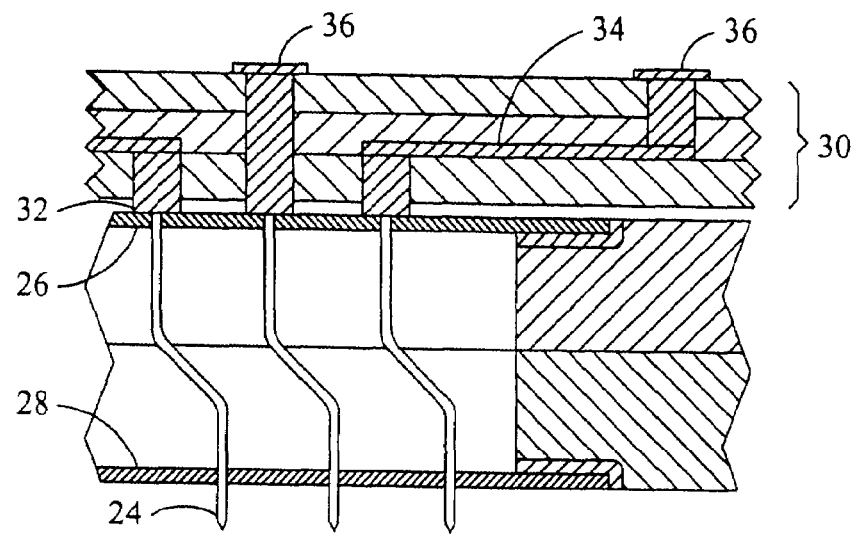
FIG. 2 is a cross-section of a needle card probe head for use in a needle-type probing assembly.
Figure 3:
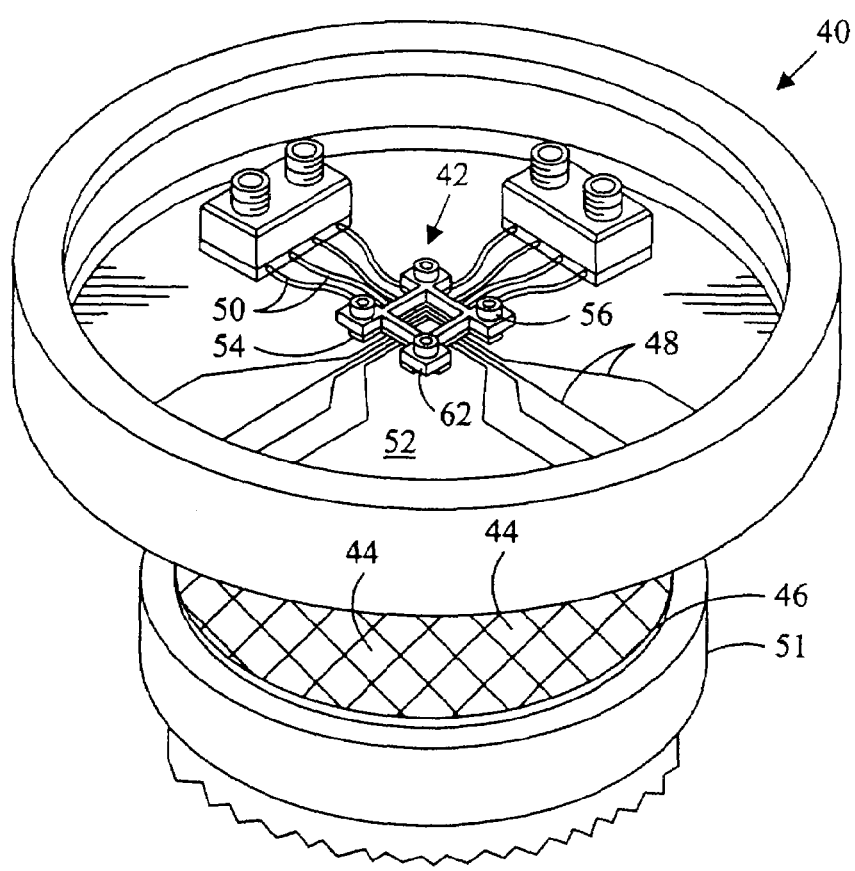
FIG. 3 is a perspective view of a membrane probing assembly bolted to a probe head and a wafer supported on a chuck in suitable position for probing by this assembly.
Figure 4:
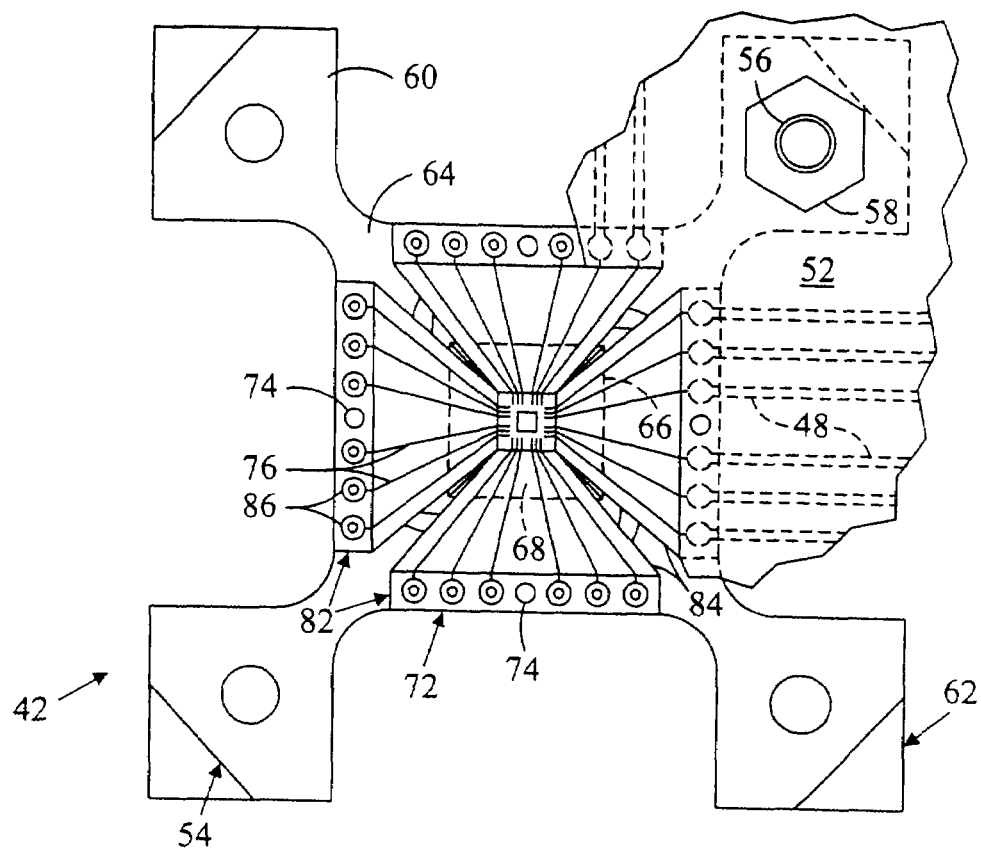
FIG. 4 is a bottom view showing various parts of the probing assembly of FIG. 3, including a support element and flexible membrane assembly, and a fragmentary view of a probe card having data/signal lines connected with corresponding lines on the membrane assembly.
Figure 5:
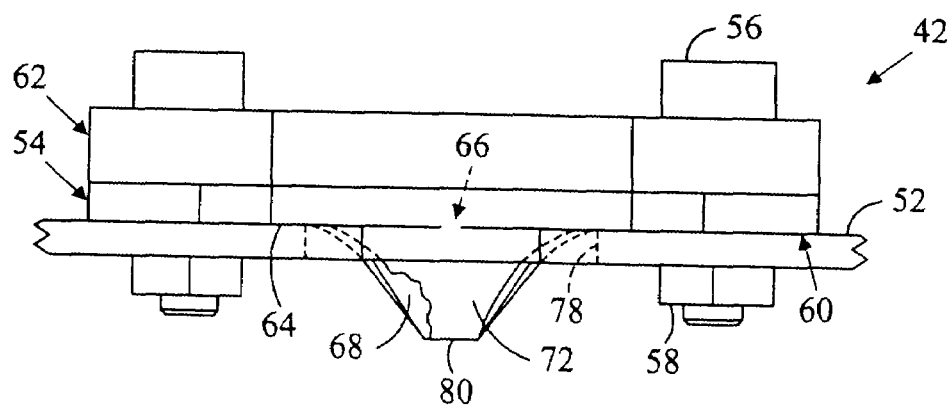
FIG. 5 is a side elevational view of the membrane probing assembly of FIG. 3 where a portion of the membrane assembly has been cut away to expose hidden portions of the support element.
Figure 6:
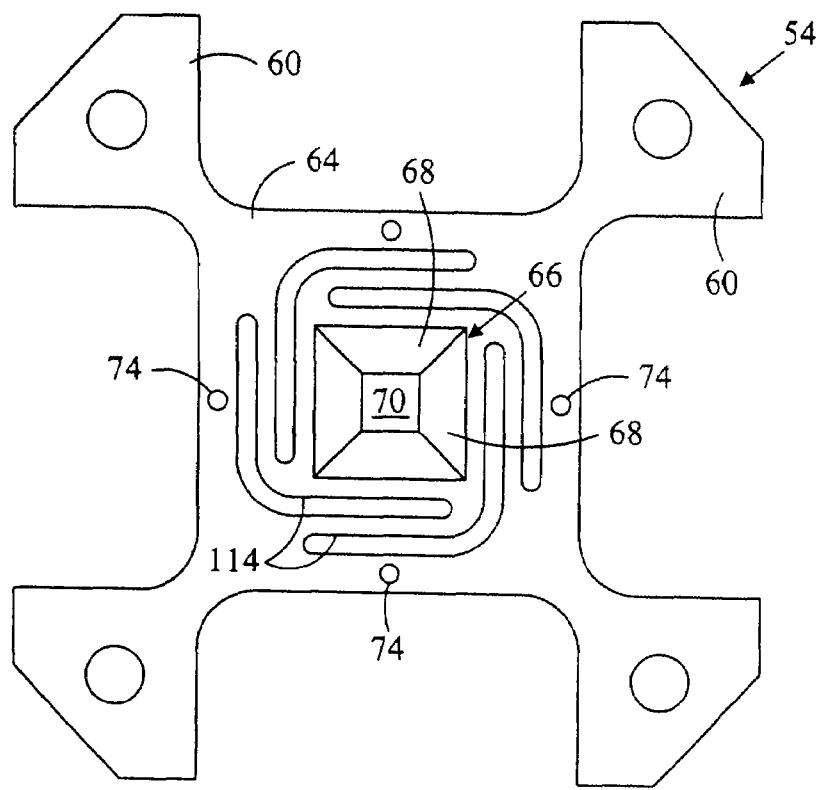
FIG. 6 is a top elevational view of an exemplary support element.
Figure 7A:
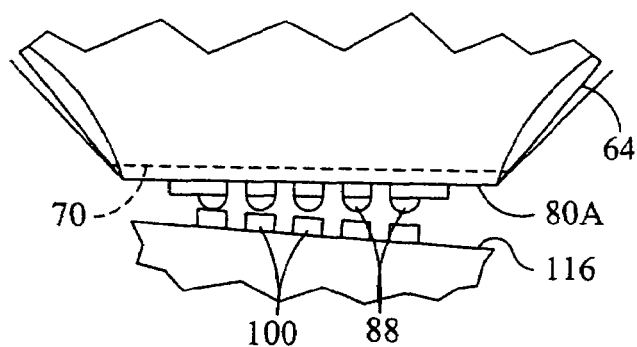
FIGS. 7a and 7b are schematic side elevational views illustrating how the support element and membrane assembly are capable of tilting to match the orientation of the device under test.
Figure 7B:
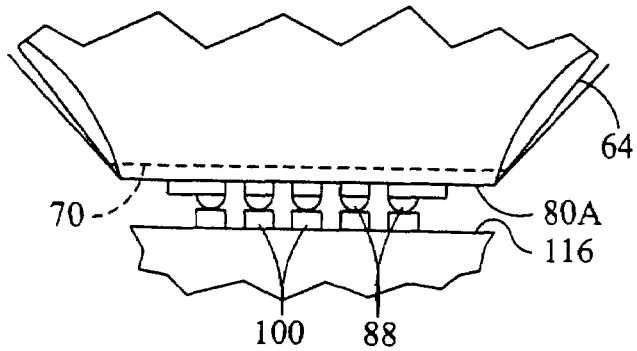
Figure 8:
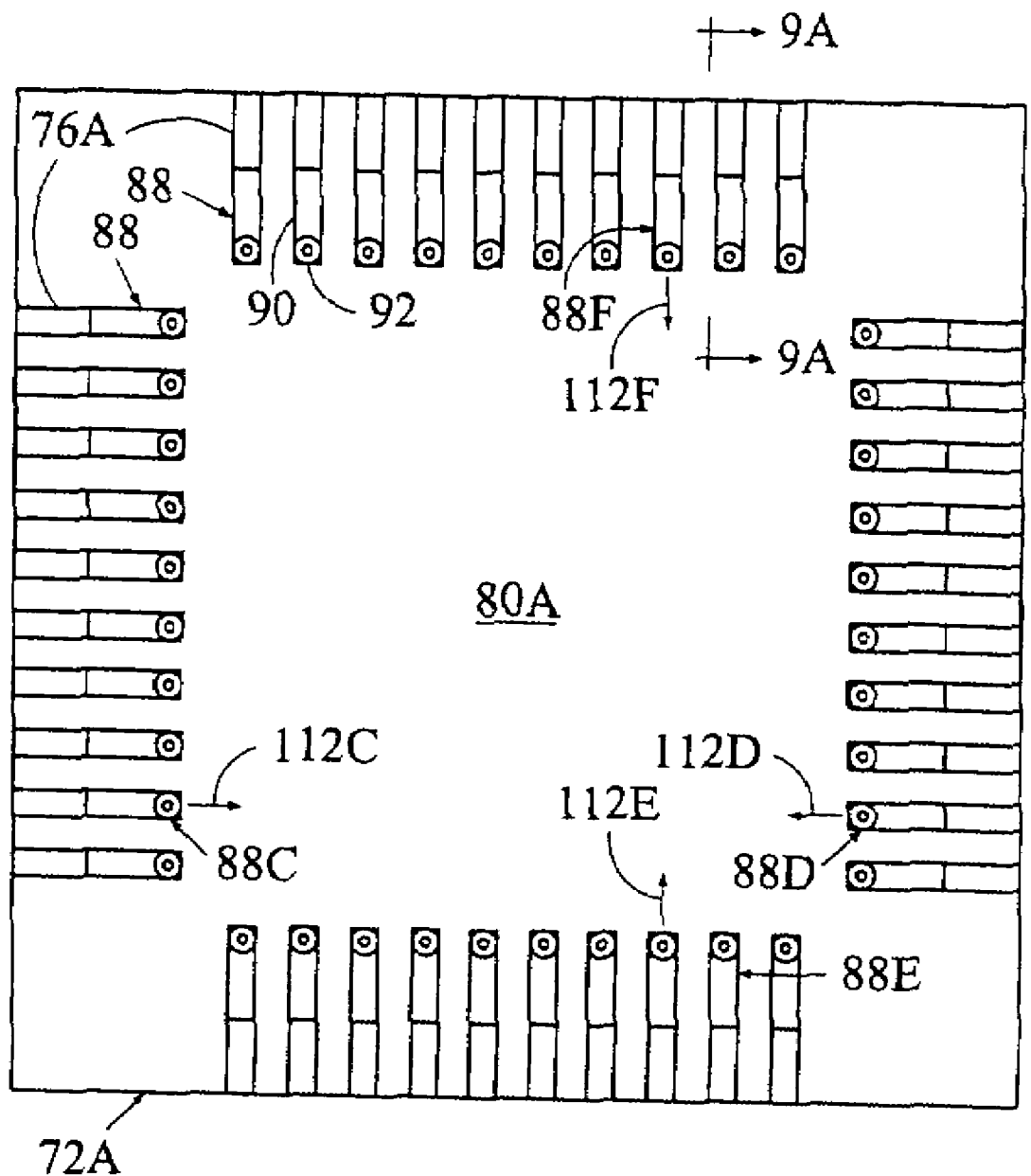
FIG. 8 is an enlarged top elevational view of the central region of the construction of the membrane assembly of FIG. 4.
Figure 9A:
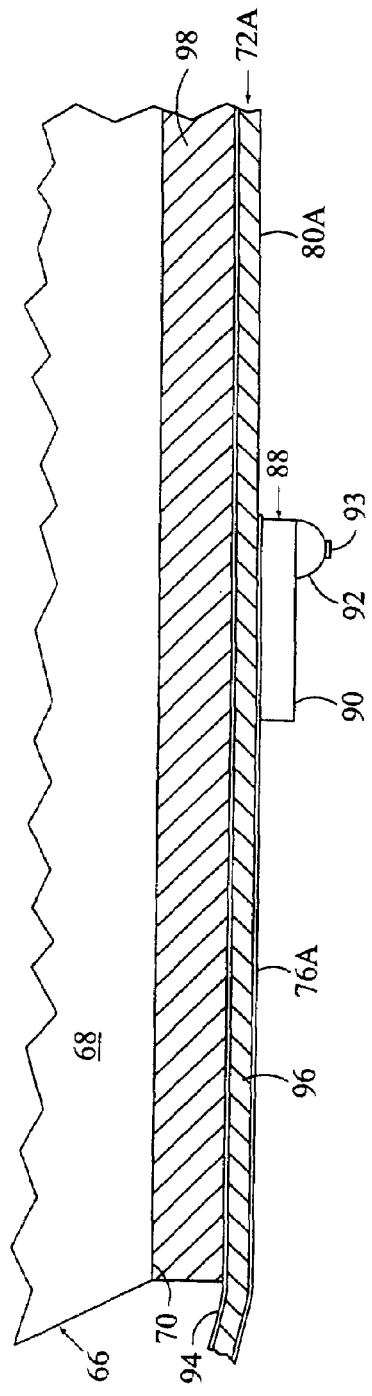
FIGS. 9a-9b are sectional views taken along lines 9a-9a in FIG. 8 first showing a contact before touchdown and then showing the same contact after touchdown and scrub movement across its respective pad.
Figure 9B:
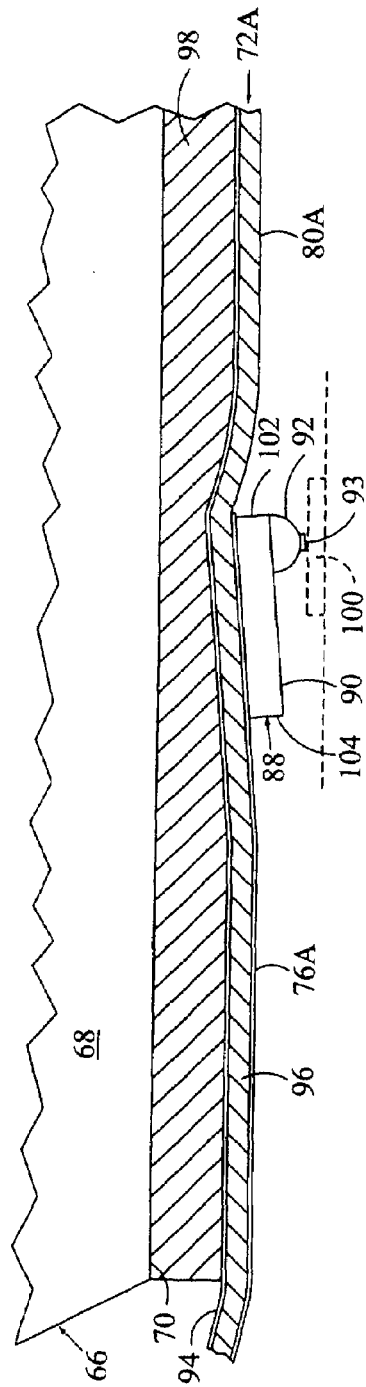
Figure 10:
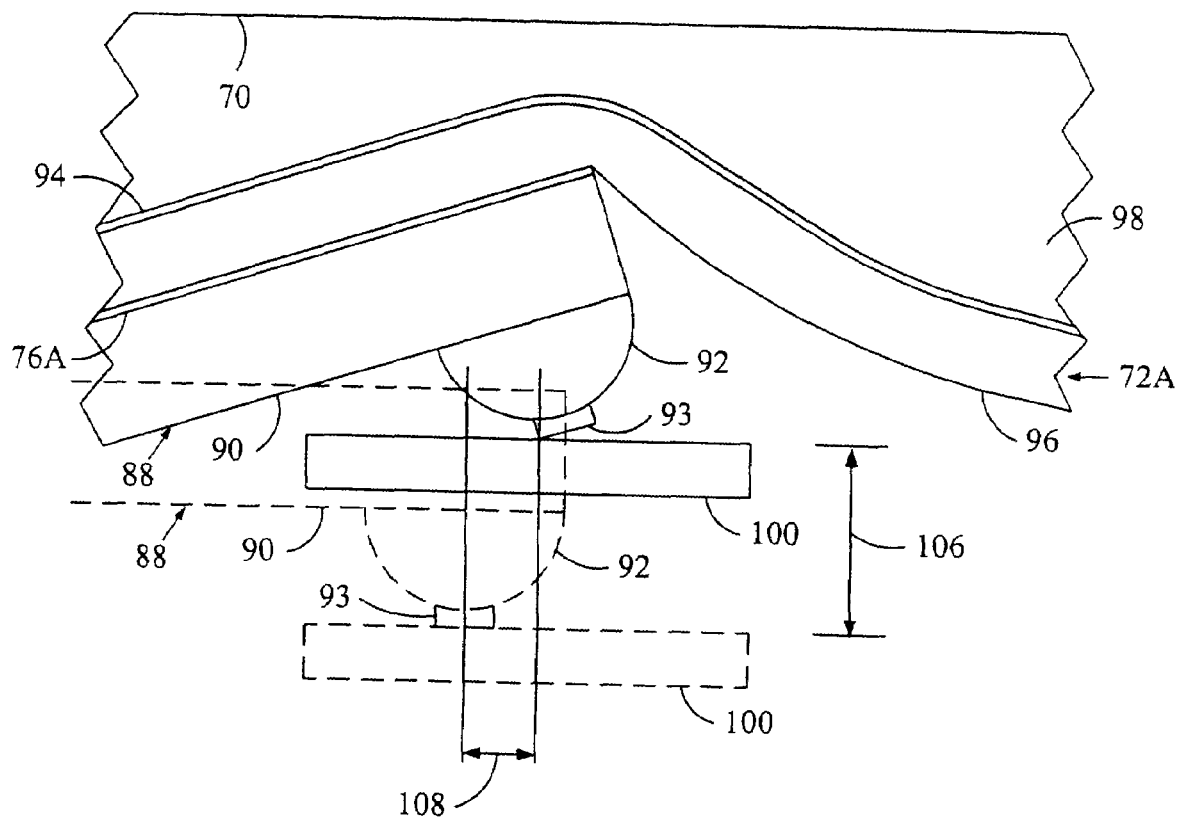
FIG. 10 is a schematic side view showing, in dashed-line representation, the contact of FIGS. 9a-9a at the moment of initial touchdown and, in solid-line representation, the same contact after further vertical overtravel by the pad.

Referring in detail to the drawings where similar parts of the invention are identified by like reference numerals, and, more particularly, to FIG. 1, an embodiment of a probing assembly 20 suitable for use with needle-type probes includes as its major functional components a probe card 38, an interposer 39, a space transformer 30, and a probe head 22. Referring also to FIG. 2, needle-like probes 24 in the probe head provide a means of making temporary interconnections to contact pads on a die included on a semiconductor wafer or other device under test (DUT) and conducting signals to and from the integrated electrical circuit on the DUT. The needle-like probes conduct the signals to and from the die through the probe head 22 to conductive terminals 32 or pads on the space transformer 30. The signal paths of the needle card-type probing assembly are typically grouped around the center of the probing assembly and substantially normal to the device under test. While needle probes have been used extensively in probing ICs, needle probes have a number of limitations making them less than ideal for probing ICs and other devices having finely pitched features or operating at high frequencies.

Figure 11:
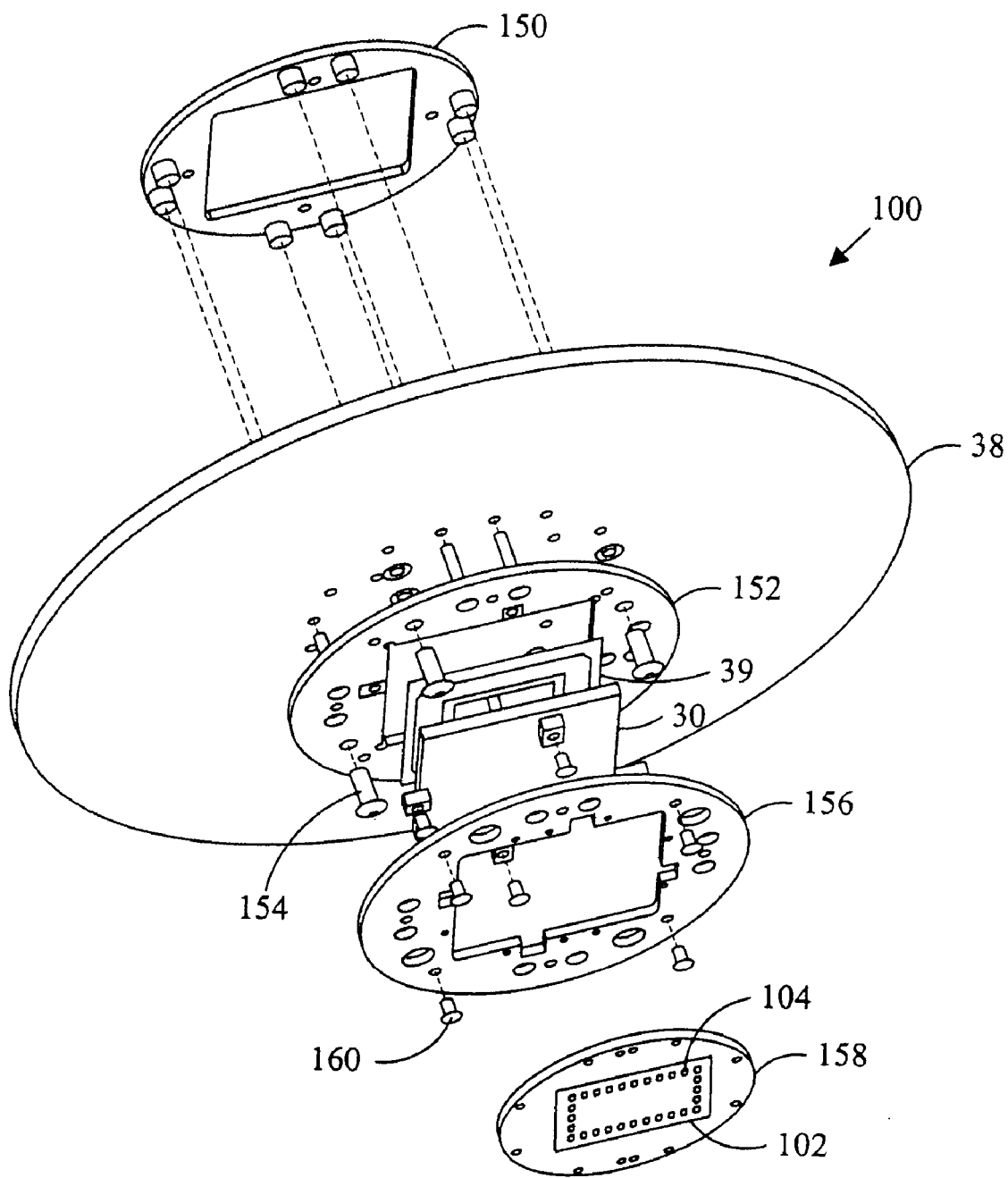
FIG. 11 is an exploded perspective schematic diagram of a probing assembly including a space transformer suitable for a needle-type probe head and a probe head having membrane suspended probes.
Figure 12:
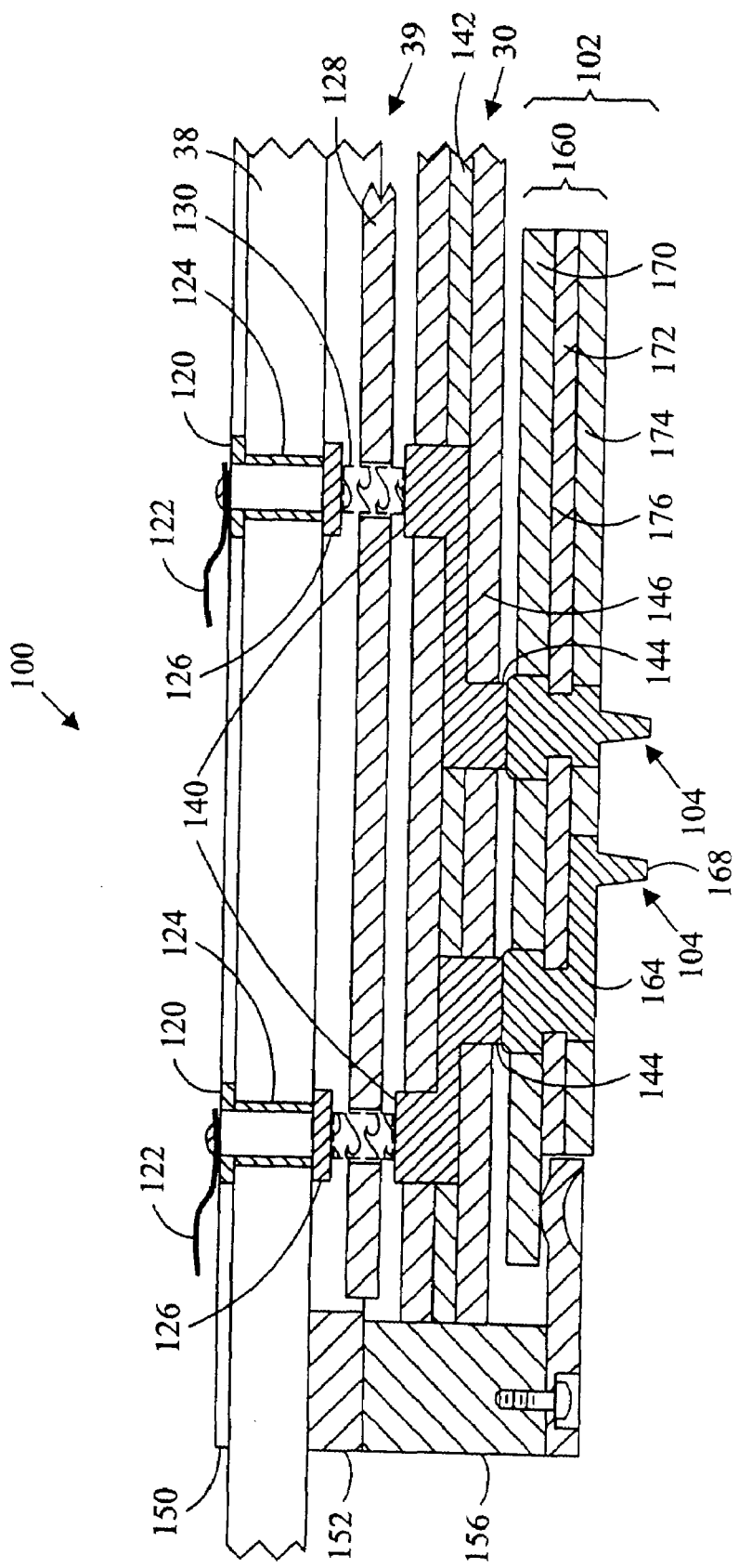
FIG. 12 is a schematic cross-sectional view of the probing assembly of FIG. 11.

On the other hand, membrane probes can exhibit substantially lower inductance than needle-type probes making membrane probes desirable for probing high frequency circuitry. In addition, a membrane suspended probe tip can be arranged to provide local contact scrubbing to penetrate the insulating oxide layer that forms on the IC contact pad without accumulating contact pad material on the probe tip as is common with needle-type probes. Heretofore, probes suspended on a membrane have not been adaptable to probing assemblies intended for use with needle-type probes because the membrane suspended probes and the conductive traces connecting the probes to the probe card are disposed on the surface of an elastic membrane with the traces radiating outward over the surface of the membrane to connect to probe card terminals arranged around the periphery of the membrane. The current inventors concluded that the performance advantages of membrane suspended probes could be provided for a probing assembly originally intended for use with needle-type probes, if the membrane suspended probes could be conductively connected to a space transformer located on the opposite side of the membrane from the probe tips. FIGS. 11 and 12 illustrate a probing assembly 100 including components suitable for use with a needle card type probe head that includes a probe head 102 having a plurality of elastic membrane suspended probes 104. The needle card-type probing assembly can be converted to a probing assembly with membrane suspended probes by removing the needle card-type probe head and replacing it with the membrane probe head 102 that interfaces with the space transformer suitable for interfacing with the needle card-type probe head. In the schematic cross-sectional view of FIG. 12, certain elements and components are shown exaggerated, for illustrative clarity.

The probe card 38 is generally a conventional circuit board substrate having a plurality of terminals 120 (two of many shown) disposed on a surface thereof. The terminals provide an interface for wires 122 that connect instrumentation (not shown) to the probing assembly. As illustrated, the wires 122 may be connected to terminals 120 on one side of the probe card 38 which are, in turn, connected by conductive vias 124 to terminals 126 or traces on the opposing side of the circuit board. Additional components (not shown), such as active and passive electronic components, connectors, and the like, may be mounted to the probe card 38 and connected to additional terminals 120. The probe card 38 is typically round and commonly has a diameter on the order of 12 inches. The terminals 122, 126 on the circuit board are often arranged at a 100 mil pitch or separation distance.

While some probing assemblies do not utilize an interposer, the probing assembly 100 includes an interposer 39 disposed between the probe card 38 and the space transformer 30. An interposer comprises interconnected electrical contacts disposed on opposing sides of a substrate so that components on opposing sides of the substrate can be conductively interconnected. An interposer is often used in a probing assembly to facilitate reliable conductive connection between the terminals of a probe card and the terminals on a space transformer. The interposer is also aids in accommodating differences in thermal expansion of the probe card 38 and the space transformer 30. The interposer 39 comprises a substrate 128 and a plurality of fuzz buttons 130 (two of many are shown) that protrude through holes in the substrate. The fuzz buttons 130 each comprise a fine wire that is compressed into a small cylindrical shape to produce an electrically conductive, elastic wire mass. As a general proposition, the fuzz buttons 130 are arranged at a pitch which matches that of the terminals 126 of the probe card 38. One end of each of the conductive fuzz buttons 130 is in contact with a terminal on the probe card 38 while the second end of the fuzz button is in contact with a terminal 140 on the space transformer 30. The elastic fuzz buttons 130 are compressed providing compliance to accommodate variations in the separation distances between of the various terminals of the probe card and the space transformer and exerting pressure on the contacts to promote good conductivity.

The fuzz buttons 130 protruding through the substrate 128 of the interposer 39 contact conductive terminals 140 on one side of the space transformer 30. The space transformer 30 (indicated by a bracket) comprises a suitable circuitized substrate 142, such as a multi-layer ceramic substrate having a plurality of terminals (contact areas, pads) 140 (two of many shown) disposed on the surface adjacent to the interposer 39 and a plurality of terminals (contact areas, pads) 144 (two of many shown) disposed on the opposing surface.

In the exemplary probing assembly 100, the contact pads 140 adjacent the interposer 39 are disposed at the pitch of the terminals of the probe card 38, and the contact pads 144 arranged on the opposing surface of the space transformer 30 are disposed at a finer pitch corresponding to the pitch and arrangement of the needle-type probes included in the needle card probe head to which the space transformer was intended to interface. While the pitch of the terminals of the probe card 38 is approximately 100 mil, the pitch of needle-type probes can be as fine as approximately 125 □m. Conductive traces 146 in the multilayer substrate 142 of the space transformer 30 re-route the electrical connections from the finely pitched pattern required to interface with the probe head to the more coarsely pitched pattern that is obtainable with a printed circuit board, such as the probe card 38.

The various elements of the probing assembly 100 are stacked and any suitable mechanism for stacking these components and ensuring reliable electrical contacts may be employed. As illustrated, the probing assembly 100 includes a rigid rear mounting plate 150 arranged on one side of the probe card 38 and a rigid front mounting plate 152 disposed on the opposing side of the probe card. Screws 154 restrain the front mounting plate to the rear mounting plate 150. A rectangular stand-off 156 with a central aperture to receive the space transformer 30 is attached to the front mounting plate. A mounting ring 158 which is preferably made of a springy material such as phosphor bronze and which may have a pattern of springy tabs extending therefrom, is attachable by screws 460 to the stand-off 156 with the space transformer 30 captured between the mounting ring and the stand-off.

The mounting ring 156 also captures and retains a probe head 102 comprising a multilayer substrate 160 (indicated by a bracket) and a plurality of electrically conductive, membrane suspended probes 104. The probes 104 comprise, generally, a relatively thick, rigid beam 164 with a beam contact 166 proximate one end of the beam and a probe tip 168 projecting from the beam proximate the second end of the beam. Although other shapes and materials may be utilized, typically, the probe tip 168 has the shape of a truncated pyramid and the projecting end of the probe tip may be coated with a layer of nickel or rhodium to provide good electrical conductivity and wear resistant when repeatedly being pressed into engagement with contact pads on a device under test. The beam contact 166 has a mushroom-shaped cross-section comprising a contact button with rounded edges, facilitating movable contact with the terminals 144 of the space transformer 30, and a cylindrical or prismatic base section that is slightly smaller than the contact button and connects the contact button to the beam. The beam contact 166 projects from the side of the beam 164 opposite the beam tip 168 and in the opposite direction. As illustrated in FIG. 12, the beam contact projects at least flush with the upper surface of the multi-layer substrate 160 so that it is exposed from the upper surface of the substrate enabling conductive contact with the corresponding terminal 144 of the space transformer 30. The ratio of the cross-section to the length is much greater for the membrane suspended probe 104 than for the typical needle probe 24 and, unlike the needle probe, the locally scrubbing, membrane suspended probe does not require a sharply pointed tip to penetrate the oxide buildup on the contact pads of the DUT. The membrane probe head 102 has a single path inductance significantly less than 0.5 nH and been demonstrated with a single path inductance of 0.2 nH. As a result, the membrane suspended probes produce significantly less signal distortion and can be used at higher frequencies than needle-type probes that typically have inductance greater than 1 nH and often as much as 2 nH.

Gleason et al., U.S. Pat. No. 6,708,386 B2, incorporated herein by reference, disclose a "bottom up" and a "top down" method for producing membrane probes. Either method can used to produce the membrane probe head 102. Membrane suspended probes 104 produced by these methods can be constructed in arrays with pitches less than 100 □m permitting the membrane suspended probes to used for testing devices with more dense contact pads than needle probes which are typically limited to pitches greater than 125 □m by manufacturing and assembly considerations. Portions of the beam contact 104 that engage the terminal 144 may also be coated with a layer nickel or rhodium to enhance electrical conductivity and wear resistance.

The multilayer substrate 160 comprises an elastic membrane 170 and a plurality of flexible insulating layers 172, 174. The elastic membrane 170 is arranged proximate to or in contact with the surface of the space transformer 30. The elastic membrane 170 may comprise a silicone rubber compound, such as ELMER'S STICK-ALLJ made by the Borden Company or Sylgard 182 by Dow Corning Corporation and is capable of exerting an elastic restoring force to a surface when the surface of the membrane is deformed. The multilayer substrate 160 of the probe head also comprises flexible first 172 and second 174 insulating layers or members. The first insulating layer 172 is disposed between the bottom surface 176 of the elastic membrane 170 and the upper surface of the beam 164 of the probe 104. The second insulating layer 174 extends downward from the bottom surface of the first insulating layer 172 to a depth approximating the thickness of the beam portion 164 of the probe 104. The first 172 and second 174 insulating layers are relatively thin and flexible in a direction normal to their surfaces but are sufficiently rigid in directions parallel to their surfaces to secure the lateral positions of the probes 104. The first 172 and second 174 insulating layers may comprise polyimide, but can comprise any other dielectric material having appropriate physical properties.

Figure 13:
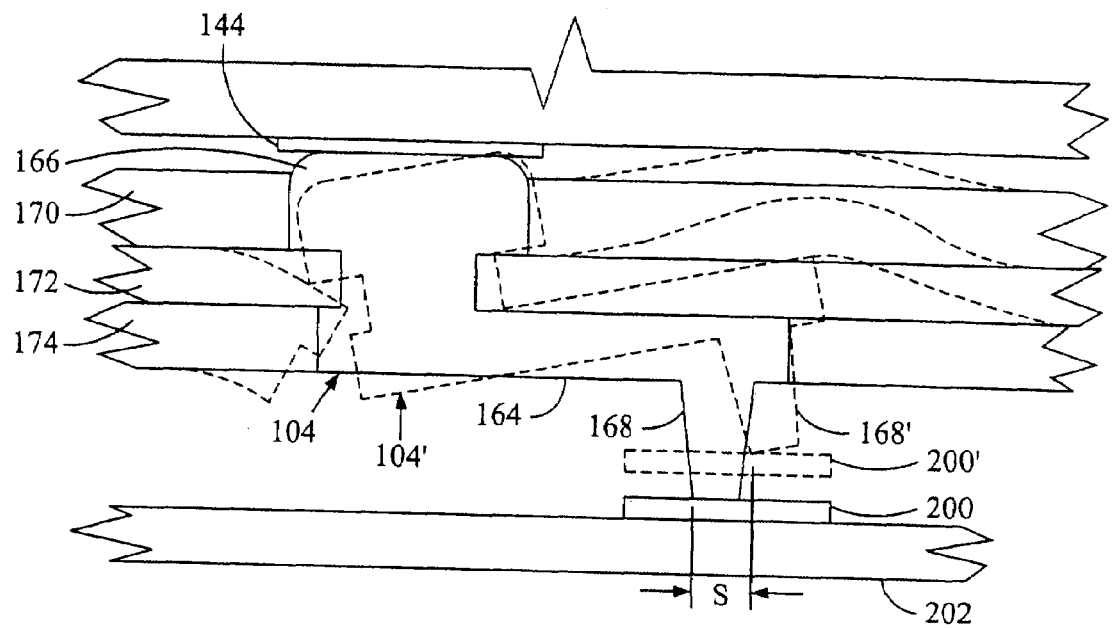
FIG. 13 is a schematic cross-sectional view of a membrane suspended probe tip contacting a contact pad of a device under test.

Referring to FIG. 13, as the probe tip 168 is brought into pressing engagement with a respective contact pad 200 on a device under test 202, the resulting contact force urges the probe tip upward toward position 168'. Upward displacement of the probe 104 is resisted by the contact force at the interface of the space transformer contact 144 and the beam contact 166. As a result, the probe 104 is rotated toward position 104' causing the end of the probe tip 168 to be displaced laterally on the contact pad 200. This lateral displacement or scrubbing ("s") abrades the insulating oxide buildup on the contact pad ensuring reliable conductance between the probe tip 168 and the contact pad. As the probe tip 168 is displaced upward, the flexible first insulating layer 172 is displaced upward by the movement of the beam 166 pushing upward on the elastic membrane 170. The surface of the membrane is stretched and distorted and the elastic membrane exerts a force to restore the first insulating layer 172 and the probe 104 to the "at rest" position. When the upper surface of the elastic membrane 170 contacts the surface of the space transformer 30, upward displacement of the probe 104 and distortion the lower surface of the elastic membrane compresses the membrane producing additional restorative force on the first insulating layer 172. The restorative force exerted by the elastic membrane 170 on the flexible insulating layer 172 returns the probe tip 104 to the initial position when the DUT 202 is moved away from the probe head 102 relieving the contact force at the probe tip 168.

Figure 14:
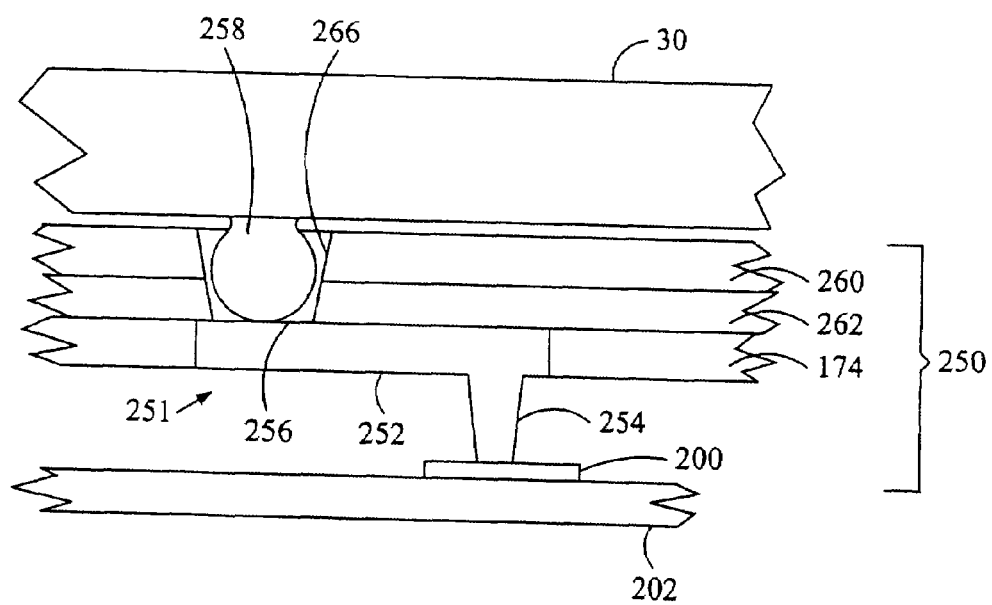
FIG. 14 is a schematic cross-sectional view of a probe head adaptable to a needle card-type space transformer and incorporating a second embodiment of a membrane suspended probe.

Referring to FIG. 14, a probe head 250 incorporating a second embodiment of a membrane suspended probe 215 may be used with space transformers 30 having projecting contacts 258, such as solder balls. The probe 251 comprises a beam 252 having a probe tip 254 projecting from the beam at one end. The beam contact 256 is exposed from the upper surface of the elastic membrane 260 through an aperture 266 that extends through the elastic membrane and the first insulating layer 262. The projecting space transformer contact 258 contacts the beam 252 at the exposed beam contact 256 proximate the end of the beam opposite the probe tip 254. When a contact pad 200 of a DUT 202 is pushed into contact with the probe tip 254 the probe rotates around the beam contact 256 producing the scrubbing action that removes the oxide buildup from the contact pad.

Figure 15:
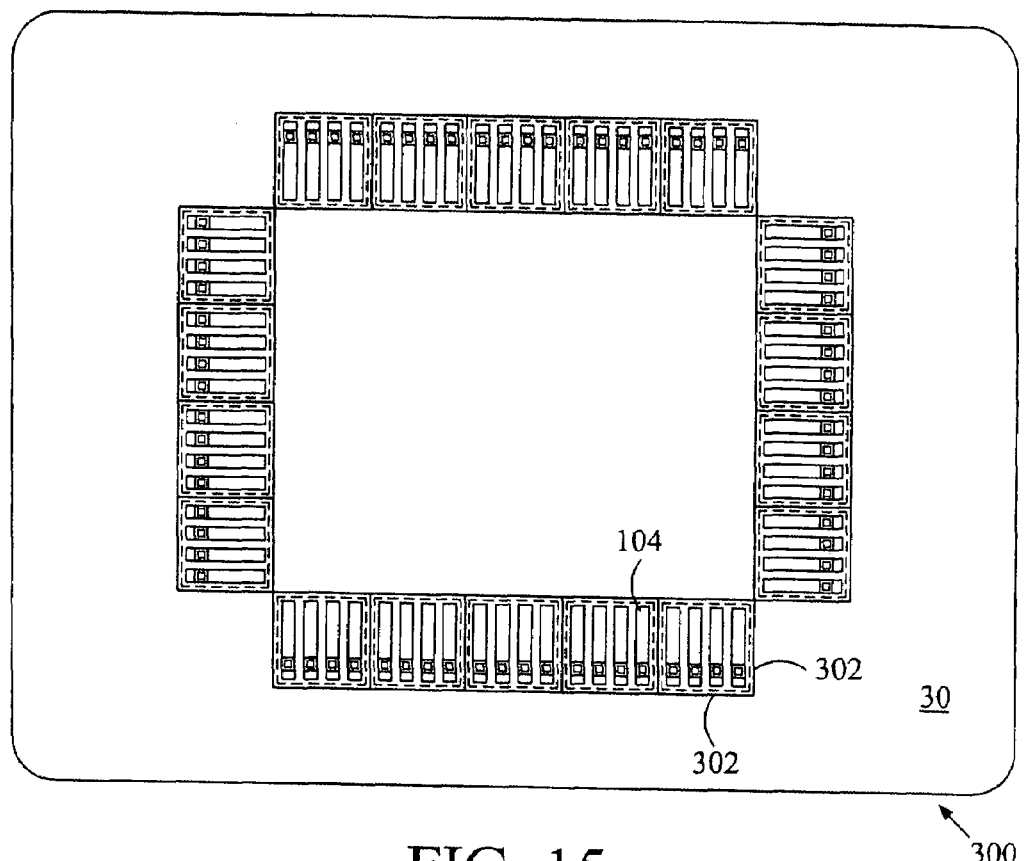
FIG. 15 is bottom view of a space transformer including a plurality of probe tiles with membrane suspended probes.
Figure 16:
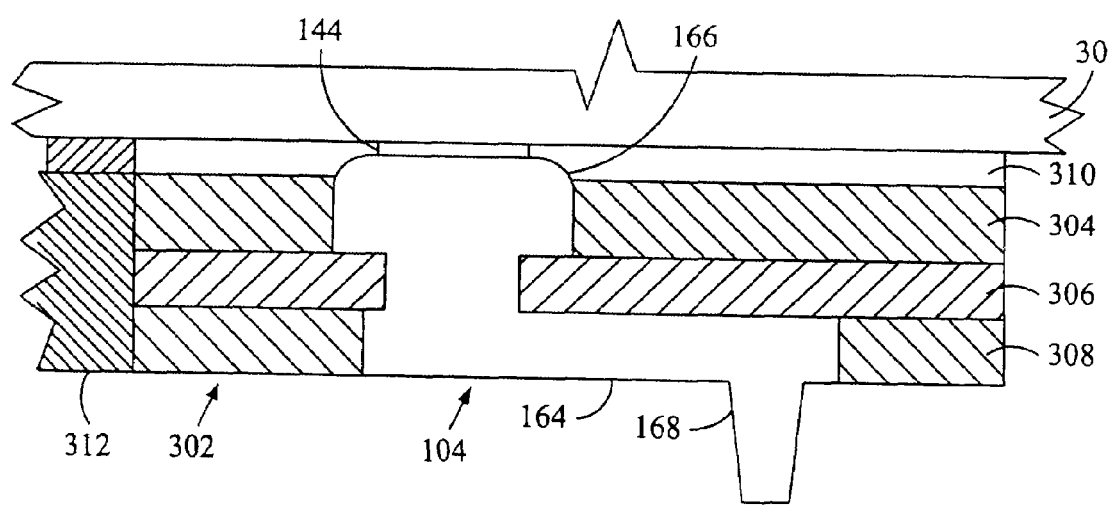
FIG. 16 is a cross-sectional view of a probe head tile including a membrane suspended probe.

Referring to FIGS. 15 and 16, in another embodiment of the probe head having membrane suspended probes 300, one or more membrane suspended probes 104 are included on a tile 302 that can be adhered to a surface of a space transformer 30. The tiles 302 comprise one or more probes 104 having a beam portion 164, an elastic membrane 304, a first insulating member 306 interposed between the beam portion of the probe and the lower surface of the elastic membrane, and a second insulating member 308 extending downward from the first insulating member approximately the depth of the beam portion of the probe. The tile 302 is secured to the surface of the space transformer 30 by a double sided adhesive interface 310 that frames the upper surface of the tile's elastic membrane 304. A space transformer 30 originally intended to interface with a needle card-type probe head can be converted to membrane suspended probes by removing the needle card-type probe head and adhering one or more tiles 302 including one or more membrane suspended probe 104 to the surface of the space transformer so that the probe's contact button 166 is positioned for contact with the space transformer contact 144. When the probe tip 168 is pressed into contact with a contact pad on a DUT, probe 104 rotates about the interface of the contact button 166 and the space transformer contact 144. The end of the beam portion 164 adjacent the probe tip 168 rotates upward producing local scrubbing of the probe tip and causing the first insulating layer 306 to distort the surface of the elastic membrane 304 which resists distortion with a restoring force. One or more blank filler tiles 312 can be adhesively adhered to the surface of the space transformer 30 to provide the probe head with a continuous surface.

A probe head with membrane suspended probes permits a needle card-type probing assembly to be converted to utilize membrane suspended probes which can be more closely pitched and exhibit substantially lower inductance than needle-type probes. Signal distortion is substantially reduced permitting testing of devices operating at higher frequencies and greater measurement accuracy at all frequencies.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe head comprising:
 (a) an elastic membrane having a first surface and an opposing second surface, said elastic membrane capable of exerting a restoring force when one of said first and said second surfaces is distorted; and
 (b) a conductive probe comprising a beam having a first end and a second end, a probe tip proximate said first end of said beam for contacting a device under test nearer said second surface than said first surface, and a beam contact proximate said second end of said beam and exposed from said first surface of said elastic membrane, said beam movable to deform said second surface of said elastic membrane.

2. The probe head of claim 1 further comprising an insulating member interposed between said beam and said elastic membrane, said insulating member movable by said beam to deform said second surface of said elastic membrane.

3. The probe head of claim 1 wherein said beam contact projects from said beam at least flush with said first surface of said elastic membrane.

4. A probe head comprising:
 (a) an elastic membrane having a first surface and an opposing second surface, said elastic membrane capable of exerting a restoring force when at least one of said first and said second surfaces is distorted;
 (b) a conductive probe comprising a beam having a first end, a second end, and a depth; a probe tip proximate said first end of said beam and projecting from said beam in a first direction; and a beam contact projecting in a second direction from said beam proximate said second end of said beam and exposed to contact from said first surface of said elastic membrane; and
 (c) a first insulating member having a first surface engaging said beam and a second surface engaging said second surface of said elastic member, said first insulating member movable by said beam to deform said second surface of said elastic membrane.

5. The probe head of claim 4 wherein said beam contact projects at least flush with said first surface of said elastic membrane.

6. The probe head of claim 4 further comprising a second insulating member having a first surface proximate said first surface of said first insulating member and a thickness approximating said depth of said beam.

7. A probing assembly comprising:
 (a) a space transformer including an exposed conductive space transformer contact;
 (b) an elastic membrane having a first surface restrainable by said space transformer and an opposing second surface, said elastic membrane capable of exerting a restoring force when said second surface is distorted; and
 (c) a conductive probe comprising a beam having a first end and a second end, a probe tip proximate said first end of said beam for contacting a device under test beam nearer said second surface of said membrane than said first surface of said membrane, and a beam contact proximate said second end of said beam and arranged to contact said space transformer contact, said beam movable to deform said second surface of said elastic membrane.

8. The probing assembly of claim 7 further comprising a first insulating member interposed between said beam and said elastic membrane, said first insulating member movable by said beam to deform said second surface of said elastic membrane.

9. The probe head of claim 7 wherein said beam contact projects from said beam at least flush with said first surface of said elastic membrane.

10. A probing assembly comprising:
(a) a space transformer having a surface and including a conductive space transformer contact exposed at said surface;
(b) an elastic membrane having a first surface restrainable by said surface of said space transformer and an opposing second surface, said elastic membrane capable of exerting a restoring force when said second surface is distorted;
(c) a conductive probe comprising a beam having a first end, a second end, and a depth, a probe tip proximate said first end of said beam and projecting from said beam in a first direction, and a beam contact proximate said second end of said beam and arranged to contact said space transformer contact; and
(d) a first insulating member having a first surface engaging said beam and a second surface engaging said second surface of said elastic member, said insulating member movable by said beam to deform said second surface of said elastic membrane.

11. The probe head of claim 10 wherein said beam contact projects from said beam in a direction opposite said first direction and at least flush with said first surface of said elastic membrane.

12. The probe head of claim 10 further comprising a second insulating member having a first surface proximate said first surface of said first insulating member and a thickness approximating said depth of said beam.

13. A method of reducing an inductance of a needle card probe assembly including a needle card probe head and a space transformer having a space transformer contact arranged to interface with said needle card probe head, said method comprising the steps of:
(a) disengaging said needle card probe head from said space transformer; and
(b) engaging said space transformer with a membrane probe head comprising;
(i) an elastic membrane having a first surface restrainable by said space transformer and an opposing second surface, said elastic membrane capable of exerting a restoring force when second surface is distorted;
(ii) a conductive probe comprising a beam having a first end, a second end, and a depth, a probe tip proximate said first end of said beam and projecting from said beam in a first direction, and a beam contact proximate said second end of said beam and arranged to contact said space transformer contact; and
(iii) a first insulating member having a first surface engaging said beam and a second surface engaging said second surface of said elastic member, said insulating member movable by said beam to deform said second surface of said elastic membrane.

14. The method of claim 13 wherein said beam contact of said membrane probe head projects from said beam in a direction opposite said first direction and at least flush with said first surface of said elastic membrane.

15. method of claim 13 wherein said membrane probe head further comprising a second insulating member having a first surface proximate said first surface of said first insulating member and a thickness approximating said depth of said beam.

16. The method of claim 13 wherein said conductive probe has a single path inductance less than one nano-Henry.

17. The method of claim 13 wherein said conductive probe has a single path inductance less than one-half nano-Henry.

18. The method of claim 13 wherein said conductive probe has a single path inductance less than one-fourth nano-Henry.

19. The method of claim 13 wherein the step of engaging said space transformer with said membrane probe head comprises the step adhering a tile including said elastic membrane and said conductive probe to a surface of said space transformer.

20. A probe head comprising:
(a) an elastic membrane having a first surface and an opposing second surface, said elastic membrane capable of exerting a restoring force when one of said first and said second surfaces is distorted; and
(b) a conductive probe comprising a beam having a first end and a second end, a probe tip proximate said first end of said beam for contacting a device under test located closer to said second surface than said first surface, and a beam contact proximate said second end of said beam and comprising a beam contact end that is located closer to said first surface than said second surface of said elastic membrane, said beam movable to deform at least one of said first surface and said second surface of said elastic membrane.

21. The probe head of claim 20 further comprising an insulating member interposed between said beam and said elastic membrane, said insulating member movable by said beam to deform said second surface of said elastic membrane.

22. The probe head of claim 20 wherein said beam contact end is located substantially flush with said first surface of said elastic membrane.

23. A probe head comprising:
(a) an elastic membrane having a first surface and an opposing second surface, said elastic membrane capable of exerting a restoring force when at least one of said first and said second surfaces is distorted;
(b) a conductive probe comprising a beam having a first end, a second end, and a depth; a probe tip proximate said first end of said beam and projecting from said beam in a first direction; and a beam contact projecting in a second direction from said beam proximate said second end of said beam and having a beam contact end distal of said beam and located nearer said first surface of said elastic membrane than said second surface of said elastic membrane; and
(c) a first insulating member having a first surface engaging said beam and a second surface engaging said second surface of said elastic member, said first insulating member movable by said beam to deform at least one of first surface and said second surface of said elastic membrane.

24. The probe head of claim 23 wherein said beam contact end is located substantially flush with said first surface of said elastic membrane.

25. The probe head of claim 23 further comprising a second insulating member having a first surface proximate said first surface of said first insulating member.

26. A probing assembly comprising:
(a) a space transformer including an exposed conductive space transformer contact;
(b) an elastic membrane having a first surface restrainable by said space transformer and an opposing second surface, said elastic membrane capable of exerting a restoring force when said second surface is distorted; and
(c) a conductive probe comprising:
   (i) a beam having a first end and a second end;
   (ii) a probe tip proximate said first end of said beam for contacting a device under test located nearer said second surface of said membrane than said first surface of said membrane; and
   (iii) a beam contact proximate said second end of said beam and arranged to contact said space transformer contact at a location nearer said first surface of said membrane than said second surface of said membrane, said beam movable to deform at least one of said first surface said second surface of said membrane.

27. The probing assembly of claim 26 further comprising a first insulating member interposed between said beam and said elastic membrane, said first insulating member movable by said beam to deform said second surface of said elastic membrane.

28. The probe head of claim 26 wherein said beam contact projects from said beam to a location at least flush with said first surface of said elastic membrane.

29. A probing assembly comprising:
(a) a space transformer having a surface and including a conductive space transformer contact exposed at said surface;
(b) an elastic membrane having a first surface restrainable by said surface of said space transformer and an opposing second surface, said elastic membrane capable of exerting a restoring force when said second surface is distorted;
(c) a conductive probe comprising:
   (i) a beam having a first end, a second end, and a depth;
   (ii) a probe tip proximate said first end of said beam and projecting from said beam in a first direction; and
   (iii) a beam contact proximate said second end of said beam and arranged to contact said space transformer contact at a location nearer said first surface of said elastic membrane than said second surface of said elastic membrane; and
(d) a first insulating member having a first surface engaging said beam and a second surface engaging said second surface of said elastic member, said insulating member movable by said beam to deform said second surface of said elastic membrane.

30. The probe head of claim 29 wherein said beam contact projects from said beam in a direction opposite said first direction and terminates at a location that is at least flush with said first surface of said elastic membrane.

31. The probe head of claim 29 further comprising a second insulating member having a first surface proximate said first surface of said first insulating member and a thickness approximating said depth of said beam.

32. A method of reducing an inductance of a needle card probe assembly including a needle card probe head and a space transformer having a space transformer contact arranged to interface with said needle card probe head, said method comprising the steps of:
(a) disengaging said needle card probe head from said space transformer; and
(b) engaging said space transformer with a membrane probe head comprising;
   (i) an elastic membrane having a first surface restrainable by said space transformer and an opposing second surface, said elastic membrane capable of exerting a restoring force when second surface is distorted;
   (ii) a conductive probe comprising a beam having a first end, a second end, and a depth, a probe tip proximate said first end of said beam and projecting from said beam in a first direction, and a beam contact proximate said second end of said beam and arranged to contact said space transformer contact at a location nearer said first surface of said membrane than said second surface of said membrane; and
   (iii) a first insulating member having a first surface engaging said beam and a second surface engaging said second surface of said elastic member, said insulating member movable by said beam to deform said second surface of said elastic membrane.

33. The method of claim 32 wherein said beam contact of said membrane probe head projects from said beam in a direction opposite said first direction and terminates at a location at least flush with said first surface of said elastic membrane.

34. The method of claim 32 wherein said membrane probe head further comprising a second insulating member having a first surface proximate said first surface of said first insulating member and a thickness approximating said depth of said beam.

35. The method of claim 32 wherein said conductive probe has a single path inductance less than one nano-Henry.

36. The method of claim 32 wherein said conductive probe has a single path inductance less than one-half nano-Henry.

37. The method of claim 32 wherein said conductive probe has a single path inductance less than one-fourth nano-Henry.

38. The method of claim 32 wherein the step of engaging said space transformer with said membrane probe head comprises the step adhering a tile including said elastic membrane and said conductive probe to a surface of said space transformer.

* * * * *

UNITED STATES PATENT AND TRADEMARK OFFICE
CERTIFICATE OF CORRECTION

| | |
|---|---|
| PATENT NO. | : 7,368,927 B2 |
| APPLICATION NO. | : 11/175600 |
| DATED | : May 6, 2008 |
| INVENTOR(S) | : Kenneth R. Smith et al. |

It is certified that error appears in the above-identified patent and that said Letters Patent is hereby corrected as shown below:

Col. 1, line 10
Change "Victoria Van Sycle" to --Victoria Van Syckle--.

Col. 2, line 29
Change "125 ▫m," to --125 µm,--.

Col. 2, line 32
Change "probe must sharpened" to --probe must be sharpened--.

Col. 6, line 40
Change "The interposer is also aids" to --The interposer also aids--.

Col. 6, line 55
Change "between of the various" to --between the various--.

Col. 7, line 10
Change "125 ▫m." to --125 µm.--.

Col. 8, line 7
Change "method can used" to --method can be used--.

Col. 8, line 10-11
Change "100 ▫m" to --100 µm--.

Col. 8, line 11
Change "probes to used" to --probes to be used--.

Col. 8, line 14
Change "125 ▫m" to --125 µm--.

Col. 8, line 16
Change "a layer nickel" to --a layer of nickel--.

Col. 8, line 63
Change "distortion the lower surface" to --distortion of the lower surface--.

Col. 10, line 64-65
Change "test beam nearer said second surface" to --test nearer said second surface--.

UNITED STATES PATENT AND TRADEMARK OFFICE
CERTIFICATE OF CORRECTION

PATENT NO. : 7,368,927 B2
APPLICATION NO. : 11/175600
DATED : May 6, 2008
INVENTOR(S) : Kenneth R. Smith et al.

It is certified that error appears in the above-identified patent and that said Letters Patent is hereby corrected as shown below:

Col. 12, line 3
Change "15. method of claim 13" to --15. The method of claim 13--.

Col. 12, line 4
Change "further comprising a second insulating member" to --further comprises a second insulating member--.

Col. 12, line 18
Change "the step adhering a tile" to --the step of adhering a tile--.

Col. 14, line 40
Change "further comprising a second insulating member" to --further comprises a second insulating member--.

Signed and Sealed this

Thirtieth Day of September, 2008

JON W. DUDAS
*Director of the United States Patent and Trademark Office*